United States Patent
Yang

(10) Patent No.: US 10,944,429 B1
(45) Date of Patent: Mar. 9, 2021

(54) DATA ACCESSING METHOD USING DATA PROTECTION WITH AID OF PARITY CHECK MATRIX HAVING PARTIAL SEQUENTIAL INFORMATION, AND ASSOCIATED APPARATUS

(71) Applicant: Silicon Motion, Inc., Hsinchu County (TW)

(72) Inventor: Tsung-Chieh Yang, Hsinchu (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/732,354

(22) Filed: Jan. 2, 2020

(51) Int. Cl.
  *H03M 13/15* (2006.01)
  *G06F 11/10* (2006.01)
  *H03M 13/00* (2006.01)

(52) U.S. Cl.
  CPC ..... *H03M 13/1575* (2013.01); *G06F 11/1076* (2013.01); *H03M 13/616* (2013.01)

(58) Field of Classification Search
  CPC ............ H03M 13/1575; H03M 13/616; G06F 11/1076
  See application file for complete search history.

(56) References Cited

U.S. PATENT DOCUMENTS

| | | | | |
|---|---|---|---|---|
| 5,757,823 A * | 5/1998 | Chen | ................... | G06F 11/1028 714/752 |
| 10,193,574 B1 * | 1/2019 | Teitel | ................ | H03M 13/159 |
| 2002/0152444 A1 * | 10/2002 | Chen | ................... | H03M 13/151 714/785 |
| 2002/0188909 A1 * | 12/2002 | Chen | ................. | H03M 13/6575 714/785 |
| 2006/0282756 A1 * | 12/2006 | Gammel | ............... | H03M 13/19 714/801 |
| 2013/0031440 A1 * | 1/2013 | Sharon | ............... | H03M 13/1128 714/758 |
| 2015/0007001 A1 * | 1/2015 | Kern | ................... | H03M 13/616 714/785 |
| 2020/0142771 A1 * | 5/2020 | Cho | ....................... | G11C 29/52 |
| 2020/0162108 A1 * | 5/2020 | Kim | .................... | G06F 11/1068 |
| 2020/0192754 A1 * | 6/2020 | Cho | ....................... | G11C 29/52 |
| 2020/0313693 A1 * | 10/2020 | Jo | ...................... | H03M 13/1125 |
| 2020/0336156 A1 * | 10/2020 | Kim | .................... | H03M 13/116 |

* cited by examiner

*Primary Examiner* — Kyle Vallecillo
(74) *Attorney, Agent, or Firm* — Winston Hsu

(57) ABSTRACT

A data accessing method using data protection with aid of a parity check matrix having partial sequential information, and associated apparatus such as memory device, memory controller, and decoding circuit thereof are provided. The data accessing method may include: in response to a read request, starting receiving protected data corresponding to the read request from predetermined storage space; generating the parity check matrix; performing syndrome calculation based on the parity check matrix according to a codeword to generate and output a syndrome for the codeword; performing error detection according to the syndrome to generate and output a decoding result signal, and performing error location decoding according to the syndrome to generate and output an error location; performing error correction of the codeword, to correct an error at the error location of the codeword; and performing further processing according to the one or more codewords obtained from the protected data.

20 Claims, 13 Drawing Sheets

DATA ACCESSING METHOD USING DATA PROTECTION WITH AID OF PARITY CHECK MATRIX HAVING PARTIAL SEQUENTIAL INFORMATION, AND ASSOCIATED APPARATUS

BACKGROUND OF THE INVENTION

1. Field of the Invention

The present invention is related to memory control, and more particularly, to a data accessing method using data protection with aid of a parity check matrix having partial sequential information, and associated apparatus such as a memory device, a memory controller of the memory device, and a decoding circuit of the memory controller.

2. Description of the Prior Art

Developments in memory technology have enabled the wide application of various portable and non-portable memory devices (e.g. memory cards conforming to the SD/MMC, CF, MS, XD or UFS specifications, solid state drives (SSDs), embedded storage devices conforming to the UFS or EMMC specifications, etc.). Improving access control of memories in these memory devices remains an issue to be solved in the art.

NAND flash memories may comprise single level cell (SLC) and multiple level cell (MLC) flash memories. In an SLC flash memory, each transistor used as a memory cell may have either of two electrical charge values respectively corresponding to logic values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in memory devices than an SLC flash memory. The MLC flash memory does have instability issues, however. To ensure that access control of the flash memory in the memory device meets required specifications, a controller of the flash memory may be equipped with some management mechanisms for properly managing data access.

Even memory devices with the above management mechanisms may have certain deficiencies, however. For example, during a certain type of encoding/decoding in error correction code (ECC) processing, the calculation of the associated matrix multiplication may rely on pre-calculated information to prevent encoding/decoding delay, and the pre-calculated information may require certain amount of storage space within the hardware architecture of a controller integrated circuit (IC), where the amount of storage space may be very great (e.g. for a Hamming code with a large codeword length, the pre-calculated information such as a large look-up table may be required during decoding). However, some side effects may be introduced. For example, as the controller IC may need to support various ECC processing specifications as required by different memory device manufacturers, the internal storage space of the controller IC may be forcibly increased, which may cause the associate costs to be increased. Hence, there is a need for a novel method and associated architecture to improve the performance of the memory device without introducing a side effect or in a way that is less likely to introduce a side effect.

SUMMARY OF THE INVENTION

It is an objective of the present invention to provide a data accessing method using data protection with aid of a parity check matrix having partial sequential information, and associated apparatus such as a memory device, a memory controller of the memory device, and a decoding circuit of the memory controller, in order to solve the above-mentioned problems.

It is another objective of the present invention to provide a data accessing method using data protection with aid of a parity check matrix having partial sequential information, and associated apparatus such as a memory device, a memory controller of the memory device, and a decoding circuit of the memory controller, in order to achieve optimal performance of the memory device.

At least one embodiment of the present invention provides a data accessing method using data protection with aid of a parity check matrix having partial sequential information, where the data accessing method is applicable to a memory controller of a memory device. The memory device may comprise the memory controller and a non-volatile (NV) memory, and the NV memory may comprise at least one NV memory element (e.g. one or more NV memory elements). The data accessing method may comprise: in response to a read request, utilizing the memory controller to start receiving protected data corresponding to the read request from predetermined storage space; utilizes a decoding circuit within the memory controller to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix; utilizing the decoding circuit to perform syndrome calculation based on the parity check matrix according to a codeword to generate and output a syndrome for the codeword, wherein the protected data comprises a read out version of one or more codewords comprising the codeword; utilizing the decoding circuit to perform error detection according to the syndrome to generate and output a decoding result signal, and perform error location decoding according to the syndrome to generate and output an error location; utilizing the decoding circuit to perform error correction of the codeword, to correct an error at the error location of the codeword, in order to recover the codeword; and utilizing the memory controller to perform further processing according to the one or more codewords obtained from the protected data.

In addition to the above method, the present invention also provides a memory device, and the memory device comprises a NV memory and a memory controller. The NV memory is arranged to store information, wherein the NV memory may comprise at least one NV memory element (e.g. one or more NV memory elements). The memory controller is coupled to the NV memory, and the memory controller is arranged to control operations of the memory device. In addition, the memory controller comprises a processing circuit, and the processing circuit is arranged to control the memory controller according to a plurality of host commands from a host device, to allow the host device to access the NV memory through the memory controller. The memory controller further comprises an error correction code (ECC) circuit that is coupled to the processing circuit, and the ECC circuit is arranged to perform ECC processing. The ECC circuit comprises a decoding circuit, and the decoding circuit is arranged to perform decoding with aid of a parity check matrix having partial sequential information, for data protection during data accessing. For example, in response to a read request, the memory controller starts receiving protected data corresponding to the read request from predetermined storage space; the memory controller utilizes the decoding circuit to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix; the memory controller utilizes the decoding circuit to perform syndrome calculation based on the parity check matrix according to a codeword to generate and output a syndrome for the codeword, wherein the protected data comprises a read out version of one or more codewords comprising the codeword; the memory controller utilizes the decoding circuit to perform error detection according to the syndrome to generate and output a decoding result signal, and perform error location decoding according to the syndrome to generate and output an error location; and the memory controller utilizes the decoding circuit to perform error correction of the codeword, to correct an error at the error location of the codeword, in order to recover the codeword, for performing further processing according to the one or more codewords obtained from the protected data.

In addition to the above method, the present invention also provides a memory controller of a memory device, where the memory device comprises the memory controller and an NV memory. The NV memory may comprise at least one NV memory element (e.g. one or more NV memory elements). In addition, the memory controller comprises a processing circuit, and the processing circuit is arranged to control the memory controller according to a plurality of host commands from a host device, to allow the host device to access the NV memory through the memory controller. The memory controller further comprises an ECC circuit that is coupled to the processing circuit, and the ECC circuit is arranged to perform ECC processing. The ECC circuit comprises a decoding circuit, and the decoding circuit is arranged to perform decoding with aid of a parity check matrix having partial sequential information, for data protection during data accessing. For example, in response to a read request, the memory controller starts receiving protected data corresponding to the read request from predetermined storage space; the memory controller utilizes the decoding circuit to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix; the memory controller utilizes the decoding circuit to perform syndrome calculation based on the parity check matrix according to a codeword to generate and output a syndrome for the codeword, wherein the protected data comprises a read out version of one or more codewords comprising the codeword; the memory controller utilizes the decoding circuit to perform error detection according to the syndrome to generate and output a decoding result signal, and perform error location decoding according to the syndrome to generate and output an error location; and the memory controller utilizes the decoding circuit to perform error correction of the codeword, to correct an error at the error location of the codeword, in order to recover the codeword, for performing further processing according to the one or more codewords obtained from the protected data.

In addition to the above method, the present invention also provides a decoding circuit of a memory controller of a memory device, where the memory device comprises the memory controller and an NV memory, the memory controller comprises the decoding circuit, and the NV memory comprises at least one NV memory element (e.g. one or more NV memory elements). The decoding circuit comprises a syndrome calculator, a parity check matrix generator that is coupled to the syndrome calculator, and an error location decoder that is coupled to the syndrome calculator. For example, the syndrome calculator is arranged to perform syndrome calculation based on a parity check matrix according to a codeword to generate and output a syndrome for the codeword, wherein in response to a read request, the memory controller starts receiving protected data corresponding to the read request from predetermined storage space, wherein the protected data comprises a read out version of one or more codewords comprising the codeword. In addition, the parity check matrix generator is arranged to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix. Additionally, the error location decoder is arranged to perform error detection according to the syndrome to generate and output a decoding result signal, and perform error location decoding according to the syndrome to generate and output an error location. Further, the decoding circuit performs error correction of the codeword, to correct an error at the error location of the codeword, in order to recover the codeword, to allow the memory controller to perform further processing according to the one or more codewords obtained from the protected data.

The present invention method and associated apparatus can guarantee that the memory device can operate properly in various situations without encountering the related art problems. For example, the data accessing method provides multiple control schemes for access control. With aid of the present invention method and associated apparatus, the memory device will not suffer from the existing problems of the related art, such as the internal storage space problem, the increased cost problem, etc. In addition, as the parity check matrix can be designed with a partial regular structure, the look-up table can be simplified into some policies. Similarly, a generator matrix for encoding can be implemented in some counters rather than a built-in large matrix.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
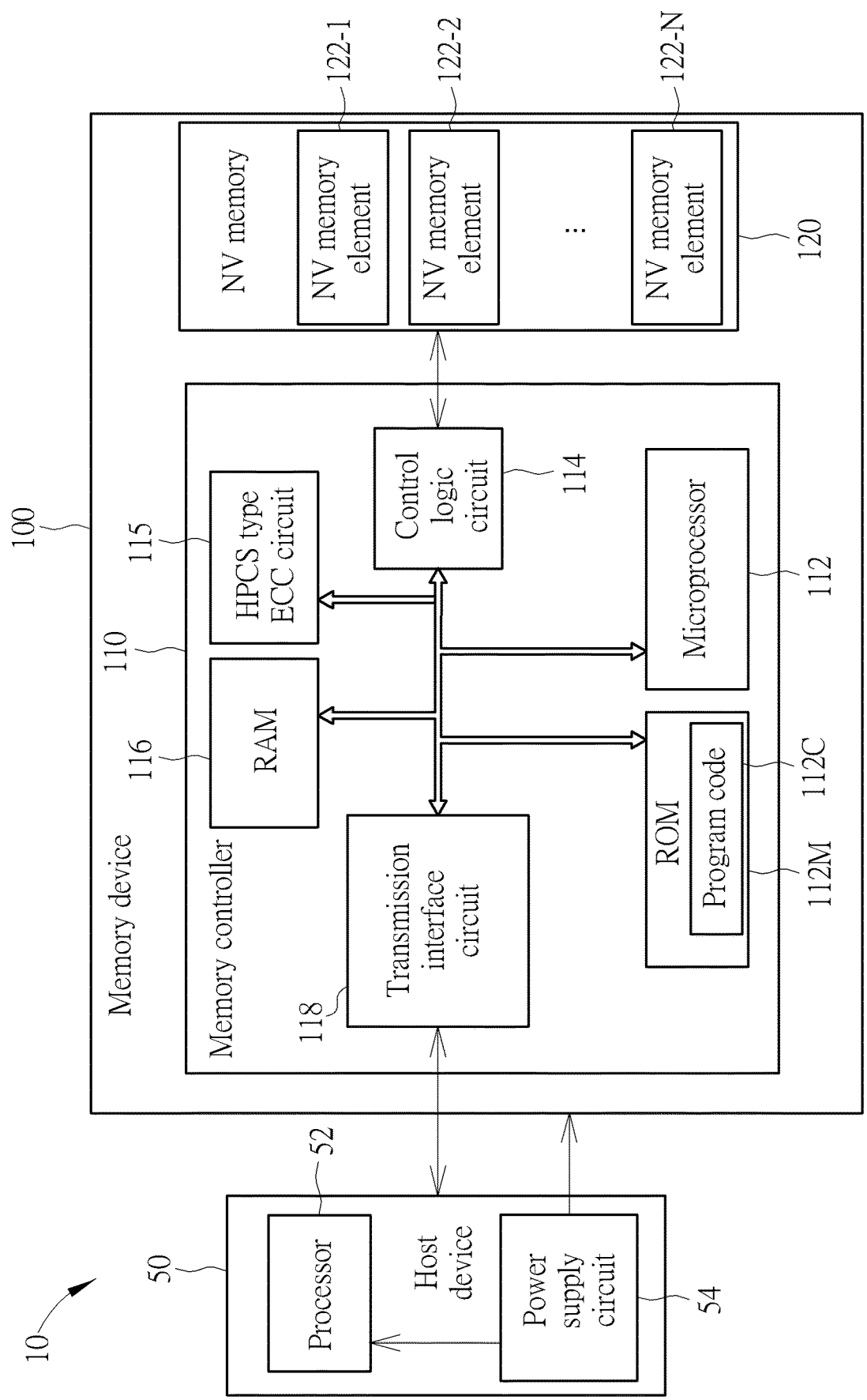
FIG. 1 is a diagram of an electronic system according to an embodiment of the present invention, where the electronic system may comprise a host device and a memory device.

FIG. 1 is a diagram of an electronic system 10 according to an embodiment of the present invention, where the electronic system 10 may comprise a host device 50 and a memory device 100. The host device 50 may comprise at least one processor (e.g. one or more processors) which may be collectively referred to as the processor 52, and may further comprise a power supply circuit 54 that is coupled to the processor 52. The processor 52 is arranged for controlling operations of the host device 50, and the power supply circuit 54 is arranged for providing power to the processor 52 and the memory device 100, and outputting one or more driving voltages to the memory device 100. The memory device 100 may be arranged for providing the host device 50 with storage space, and obtaining the one or more driving voltages from the host device 50 as power source of the memory device 100. Examples of the host device 50 may include, but are not limited to: a multifunctional mobile phone, a wearable device, a tablet computer, and a personal computer such as a desktop computer and a laptop computer. Examples of the memory device 100 may include, but are not limited to: a solid state drive (SSD), and an embedded storage device such as that conforming to Universal Flash Storage (UFS) or embedded MMC (eMMC) specifications. According to this embodiment, the memory device 100 may comprise a memory controller 110 and a non-volatile (NV) memory 120, where the memory controller 110 is arranged to control operations of the memory device 100 and access the NV memory 120, and the NV memory 120 is arranged to store information. The NV memory 120 may comprise at least one NV memory element (e.g. one or more NV memory elements), such as a plurality of NV memory elements 122-1, 122-2, ..., and 122-N, where "N" may represent a positive integer that is greater than one. For example, the NV memory 120 may be a flash memory, and the plurality of NV memory elements 122-1, 122-2, ..., and 122-N may be a plurality of flash memory chips or a plurality of flash memory dies, but the present invention is not limited thereto.

As shown in FIG. 1, the memory controller 110 may comprise a processing circuit such as a microprocessor 112, a storage unit such as a read-only memory (ROM) 112M, a control logic circuit 114, a data protection circuit such as a high performance compact size (HPCS) type error correction code (ECC) circuit 115 (labeled "HPCS type ECC circuit" in FIG. 1, for brevity), a random access memory (RAM) 116, and a transmission interface circuit 118, where the above components may be coupled to one another via a bus. The RAM 116 is implemented by a Static RAM (SRAM), but the present invention is not limited thereto. The RAM 116 may be arranged to provide the memory controller 110 with internal storage space. For example, the RAM 116 may be utilized as a buffer memory for buffering data. In addition, the ROM 112M of this embodiment is arranged to store a program code 112C, and the microprocessor 112 is arranged to execute the program code 112C to control the access of the NV memory 120. Note that, in some examples, the program code 112C may be stored in the RAM 116 or any type of memory. Further, the data protection circuit such as the HPCS type ECC circuit 115 may protect data and/or perform error correction. The transmission interface circuit 118 may conform to a specific communications specification (e.g. UFS specification), and may perform communications according to the specific communications specification, for example, perform communications with the host device 50 for the memory device 100.

In this embodiment, the host device 50 may transmit host commands and corresponding logical addresses to the memory controller 110 to access the memory device 100. The memory controller 110 receives the host commands and the logical addresses, and translates the host commands into memory operating commands (which may be simply referred to as operating commands), and further controls the NV memory 120 with the operating commands to perform reading, writing/programming, etc. on memory units (e.g. data pages) having physical addresses within the NV memory 120, where the physical addresses may be associated with the logical addresses. When the memory controller 110 perform an erase operation on any NV memory element 122-$n0$ of the plurality of NV memory elements 122-1, 122-2, . . . , and 122-N (in which "$n0$" may represent any integer in the interval [1, N]), at least one block of multiple blocks of the NV memory element 122-$n0$ may be erased, where each block of the blocks may comprise multiple pages (e.g. data pages), and an access operation (e.g. reading or writing) may be performed on one or more pages.

According to some embodiments, the memory device 100 may be implemented to be a memory card conforming to the SD/MMC, CF, MS, XD or UFS specifications, where the memory device 100 may be coupled to the host device 50 through an intermediate device such as a memory card reader, but the present invention is not limited thereto.

Figure 2:
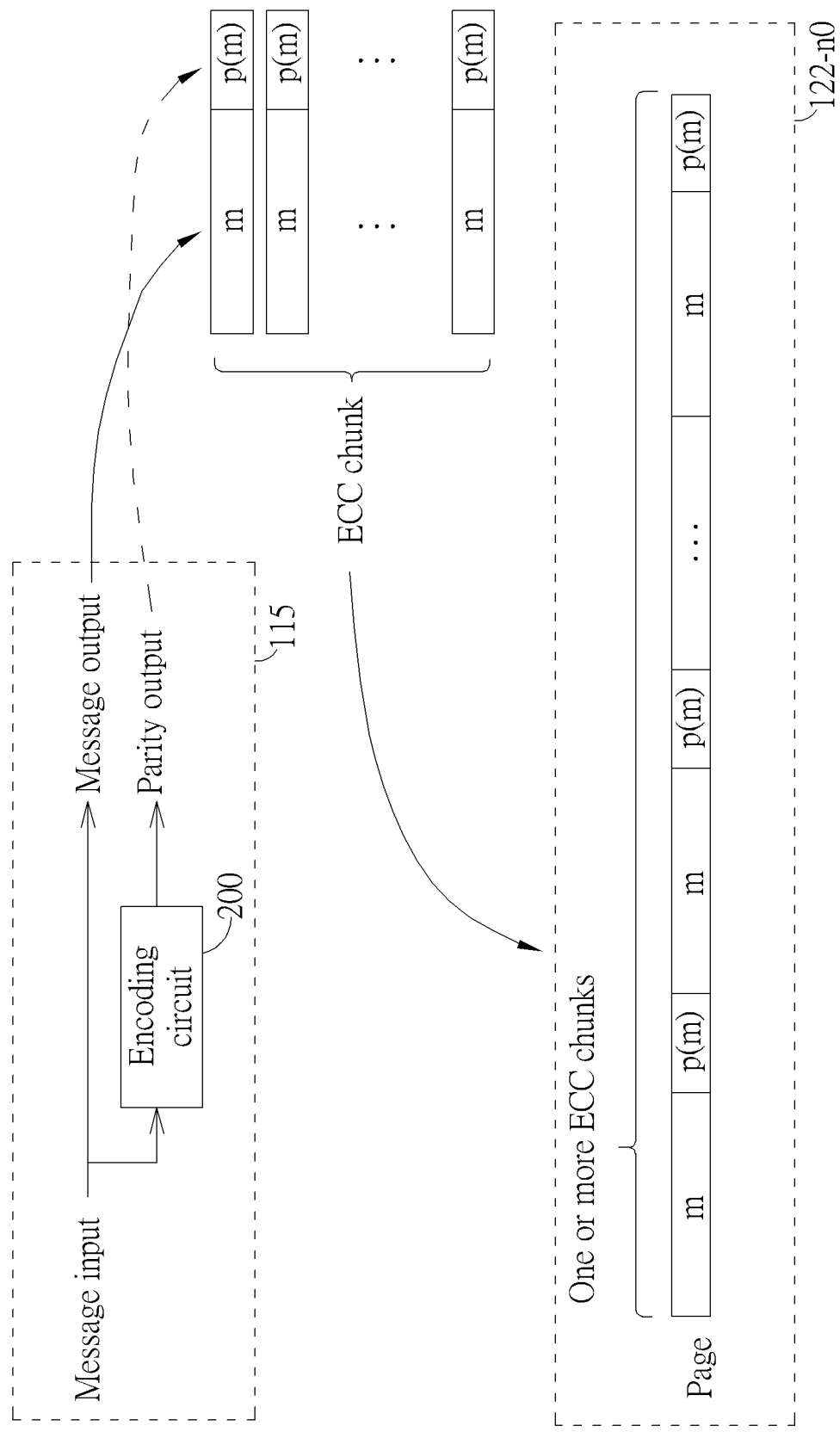
FIG. 2 illustrates some operations regarding error correction code (ECC) processing of the memory device shown in FIG. 1 and some associated components within the memory device according to an embodiment of the present invention.

FIG. 2 illustrates some operations regarding ECC processing of the memory device 100 shown in FIG. 1 and some associated components within the memory device according to an embodiment of the present invention. The HPCS type ECC circuit 115 may comprise at least one encoding circuit (e.g. one or more encoding circuits) such as the encoding circuit 200 shown in FIG. 2, and the encoding circuit 200 may comprise at least one encoder (e.g. one or more encoders) such as a Hamming code encoder, but the present invention is not limited thereto. The HPCS type ECC circuit 115 may perform ECC processing on a plurality of messages to generate a plurality of parity codes, for example, during a write operation or a read operation, where each message of the plurality of messages comprises a set of message bits, and each parity code of the plurality of parity codes comprises a set of parity bits. Taking the write operation as an example, when any message of the plurality of messages is sent into the encoding circuit 200, the message input of the encoding circuit 200 and the message output may represent this message, and the parity output of the encoding circuit 200 may represent the parity code corresponding to this message. The HPCS type ECC circuit 115 may generate an ECC chunk comprising the plurality of messages and the plurality of parity codes (respectively labeled "m" and "p(m)" in FIG. 2, for brevity) as a protection unit. For example, the ECC chunk may further comprise one or more other parity bits such as one or more rows of parity bits, for protecting the plurality of messages and the plurality of parity codes, where the one or more rows of parity bits may be attached to the rows of messages-parity code combinations within the ECC chunk shown in FIG. 2, but the present invention is not limited thereto. As shown in FIG. 2, the memory controller 110 may write or program one or more ECC chunks into a certain page in a certain block within the NV memory element 112-$n$. As the architecture of the NV memory 120 may vary depending on various design rules of NV memory manufacturers (e.g. Flash memory manufacturers), the number of ECC chunks in each page may vary correspondingly.

Based on the architecture shown in FIG. 1, the memory device 100 may store data for the host device 50, and the memory device 100 may write the data into the NV memory 120 in response to a host command such as a write command from the host device 50. During writing the data into the NV memory 120, the HPCS type ECC circuit 115 (e.g. the encoding circuit 200) may perform encoding to generate parity bits of a parity code to protect message bits of a message (e.g. any of the plurality of messages), where the message may correspond to a set of data within the data to be written into the NV memory 120. In addition, the memory device 100 may read the stored data in response to another host command such as a read command from the host device 50, and provide the host device 50 with the data read from the NV memory 120. During reading the stored data from the NV memory 120, the HPCS type ECC circuit 115 (e.g. the encoding circuit 200) may obtain a read out version of the message bits and a read out version of the parity bits. For example, the HPCS type ECC circuit 115 (e.g. the encoding circuit 200) may perform encoding on the read out version of the message bits to generate a non-read out version of the parity bits, and may determine whether the non-read out version of the parity bits and the read out version of the parity bits are the same to detect whether the read out version of the message bits is correct, but the present invention is not limited thereto. When the non-read out version of the parity bits and the read out version of the parity bits are the same, the HPCS type ECC circuit 115 (e.g. the encoding circuit 200) may determine that the read out version of the message bits is correct. As a result, the memory controller 110 may utilize the read out version of the message bits as the set of data within the stored data from the NV memory 120, for being transmitted or returned to the host device 50. When there is any difference between the non-read out version of the parity bits and the read out version of the parity bits, the HPCS type ECC circuit 115 (e.g. the encoding circuit 200) may determine that the read out version of the message bits is incorrect, and perform error correction on the read out version of the message bits according to the read out version of the parity bits to generate a correct version of the message bits. As a result, the memory controller 110 may utilize the correct version of the message bits as the set of data within the stored data from the NV memory 120, for being transmitted or returned to the host device 50. Based on the architecture shown in FIG. 1, and more particularly, the operations regarding ECC processing as shown in FIG. 2, various errors of the data stored in the NV memory 120 can be prevented.

Figure 3:
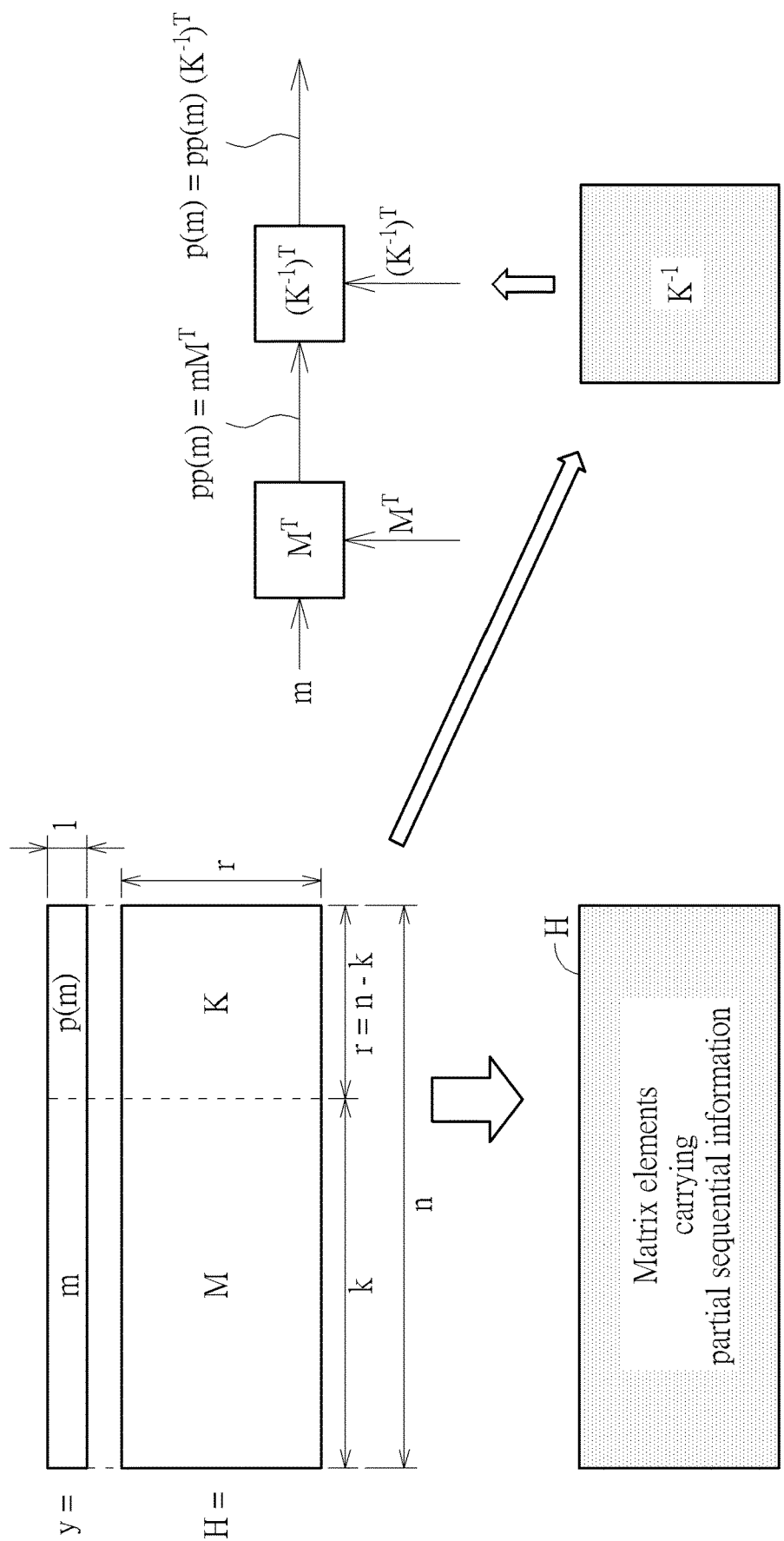
FIG. 3 illustrates an encoding control scheme of a data accessing method according to an embodiment of the present invention.

FIG. 3 illustrates an encoding control scheme of a data accessing method using data protection with aid of a parity check matrix having partial sequential information according to an embodiment of the present invention, where the data accessing method is applicable to the architecture shown in FIG. 1, and more particularly, the memory device 100, the memory controller 110, and the HPCS type ECC circuit 115 (e.g. the encoding circuit 200). For better comprehension, the memory controller 110 may receive a write command such as that mentioned above, and may receive the data corresponding to the write command (e.g. the aforementioned data to be written into the NV memory 120) from the host device 50. The encoding circuit 200 may obtain at least one portion of data (e.g. a plurality of sets of data, such as the set of data mentioned above) within the data corresponding to the write command to be the plurality of messages {m} of the ECC chunk, to generate the plurality of parity codes {p(m)} of the ECC chunk according to the plurality of messages {m} through HPCS type encoding of the encoding circuit 200, where the plurality of parity codes {p(m)} correspond to the plurality of messages {m}, respectively, for protecting the plurality of messages {m}, respectively. For example, the respective contents of the plurality of messages {m} may vary depending on the contents of the data received from the host device 50. In addition, the memory controller 110 may write the ECC chunk comprising the plurality of messages {m} and the plurality of parity codes {p(m)} into the NV memory 120. For example, regarding any message m within the plurality of messages {m}, operations of the HPCS type encoding may comprise: after at least one portion (e.g. a portion or all) of the message m is sent into the encoding circuit 200, the encoding circuit 200 starts encoding the message m to calculate a partial parity code pp(m) according to the message m and a transpose matrix $M^T$ of a part-one matrix M within a parity check matrix H, where the part-one matrix M is a first sub-matrix of the parity check matrix H; after at least one portion (e.g. a portion or all) of the partial parity code pp(m) is generated, the encoding circuit 200 may generate and/or load multiple partial matrices {PM($K^{-1}$)} of an inverse matrix $K^{-1}$ of a part-two matrix K within the parity check matrix H, respectively, where the part-two matrix K is a second sub-matrix of the parity check matrix H, and at least one portion (e.g. a portion or all) of the inverse matrix $K^{-1}$ of the part-two matrix K, such as any partial matrix PM($K^{-1}$) of the inverse matrix $K^{-1}$ (e.g. the partial matrices PM($K^{-1}$)$_1$, PM($K^{-1}$)$_2$, PM($K^{-1}$)$_3$, etc. of the inverse matrix $K^{-1}$), may be prepared in advance to be pre-calculation information; and the encoding circuit 200 applies the partial matrices {PM($K^{-1}$)} of the inverse matrix $K^{-1}$ of the part-two matrix K to the partial parity code pp(m) to generate multiple sub-parity codes (e.g. a first sub-parity code p(m)$_1$, and subsequent sub-parity codes p(m)$_2$, p(m)$_3$, etc.) of the parity code p(m) corresponding to the message m, respectively, and outputs the multiple sub-parity codes (e.g. the sub-parity codes p(m)$_1$, p(m)$_2$, p(m)$_3$, etc.) of the parity code p(m), respectively, where the first sub-parity code p(m)i may be output as a beginning portion of the parity code p(m). For example, the pre-calculation information may be generated and used at once, but the present invention is not limited thereto. In some examples, the pre-calculation information may be temporarily stored in a storage circuit within the encoding circuit 200 and used later.

For better comprehension, a codeword y comprising the message m and the parity code p(m), the parity check matrix H comprising the part-one matrix M and the part-two matrix K, and the inverse matrix $K^{-1}$ of the part-two matrix K within the parity check matrix H may be illustrated as shown in FIG. 3. The codeword y may be expressed with a 1-by-n matrix having a single row and n columns, where n may represent a positive integer. Within the codeword y, the message m may be expressed with a 1-by-k matrix having a single row and k columns, and the parity code p(m) may be expressed with a 1-by-r matrix having a single row and r columns (e.g. r=n−k), where k and r may represent positive integers, respectively. In addition, the parity check matrix H may be expressed with an r-by-n matrix having r rows and n columns. Within the parity check matrix H, the part-one matrix M may be expressed with an r-by-k matrix having r rows and k columns, and the part-two matrix K may be expressed with an r-by-r matrix having r rows and r columns. Please note that parity check matrix H may be properly designed, for example, to make it comprise matrix elements carrying partial sequential information, for enhancing the coding performance, but the present invention is not limited thereto.

The contents of the part-one matrix M and the part-two matrix K within the parity check matrix H may be determined according to some predetermined rules of the manufacturer of the memory controller 110. For example, each column of the parity check matrix H should comprise at least one (e.g. one or more) non-zero matrix element such as 1, and any two columns in the parity check matrix H should be different from each other. More particularly, the part-one matrix M may be arranged to have a set of columns corresponding to partial regular structure (e.g. one or more sets of partial sequential columns), and the part-two matrix K may be arranged to have a set of columns corresponding to regular structure, but the present invention is not limited thereto. The part-one matrix M and the inverse matrix $K^{-1}$ may be prepared in advance, for use of encoding the message m to generate the parity code p(m) corresponding to the message m.

According to this embodiment, pp(m)=$mM^T$ and p(m)=pp(m) $(K^{-1})^T$. As the transpose matrix $(K^{-1})^T$ of the inverse matrix $K^{-1}$ may be obtained from transposing the inverse matrix $K^{-1}$, and more particularly, by flipping the inverse matrix $K^{-1}$ over the diagonal of the inverse matrix $K^{-1}$, the transpose matrix $(K^{-1})^T$ may have the same matrix elements as that of the inverse matrix $K^{-1}$ except for the flipped arrangement due to flipping the inverse matrix $K^{-1}$ over the diagonal during transposing the inverse matrix $K^{-1}$. Therefore, the encoding circuit 200 may directly use any partial matrix PM($K^{-1}$) of the inverse matrix $K^{-1}$ (e.g. a plurality of rows in the partial matrix PM($K^{-1}$), such as row vectors therein) in a manner of the flipped arrangement to be the corresponding partial matrix within the transpose matrix $(K^{-1})^T$ (e.g. a plurality of columns in the corresponding partial matrix, such as column vectors therein), for example, through selecting any matrix element in the partial matrix PM($K^{-1}$) as a corresponding matrix element in the corresponding partial matrix according to the flipped arrangement.

Some implementation details regarding the relationships between the message m, the partial parity code pp(m), and the parity code p(m) may be described as follows:

Let yH=0;
⇒$mM^T$+p(m) $K^T$=0;
⇒$mM^T$=p(m) $K^T$, where they are the same for the binary case;
Let pp(m) be the partial parity code, where pp(m)=$mM^T$;
⇒pp(m)=P(m) $K^T$;
⇒pp(m) $(K^{-1})^T$=p(m) $K^T(K^{-1})^T$=p(m) $(K^{-1}K)^T$=p(m) $(I)^T$=p(m);

where the part-one matrix M and the inverse matrix $K^{-1}$ may be prepared in advance, for being used during encoding, and at least one portion (e.g. a portion or all) of the part-one matrix M and at least one portion (e.g. a portion or all) of the inverse matrix $K^{-1}$ may be stored in the encoding circuit 200 in advance, for example, stored as hardware codes (e.g. ROM codes) within the HPCS type ECC circuit 115 during a production phase of the memory controller 110, but the present invention is not limited thereto.

According to some embodiments, the memory device 100 (e.g. the memory controller 110) may utilize a portion of memory space of the host device 50, such as that of a memory (e.g. RAM) within the host device 50, as external storage space of the memory device 100, for use of management of the memory device 100. More particularly, the memory device 100 (e.g. the memory controller 110) may send internal information of the memory device 100 to the host device 50 to be stored in the external storage space (e.g. the memory within the host device 50), and may obtain or retrieve at least one portion (e.g. a portion or all) of the internal information from the external storage space when needed. In addition, the ECC processing such as that described in any of the embodiments shown in FIG. 2 and FIG. 3 may be applied to data accessing regarding the external storage space. Taking the messages {m} as an example of the internal information, the memory device 100 (e.g. the memory controller 110) may write the plurality of messages {m} and the plurality of parity codes {p(m)} respectively corresponding to the plurality of messages {m} into the external storage space, to be host-owned information such as the codewords {y}, which may comprise the plurality of messages {m} and the plurality of parity codes {p(m)}, respectively. When there is a need, the memory device 100 (e.g. the memory controller 110) may read the codewords {y} from the external storage space and perform ECC decoding on the read out version of the codewords {y}, to determine whether they are correct, and more particularly, perform error correction if one or more errors occur. For example, the memory device 100 (e.g. the memory controller 110) may obtain the plurality of messages {m} from the read out version of the codewords {y} in a situation where they are correct, or recover plurality of messages {m} from the read out version of the codewords {y} in a situation where the error correction is performed.

Figure 4:
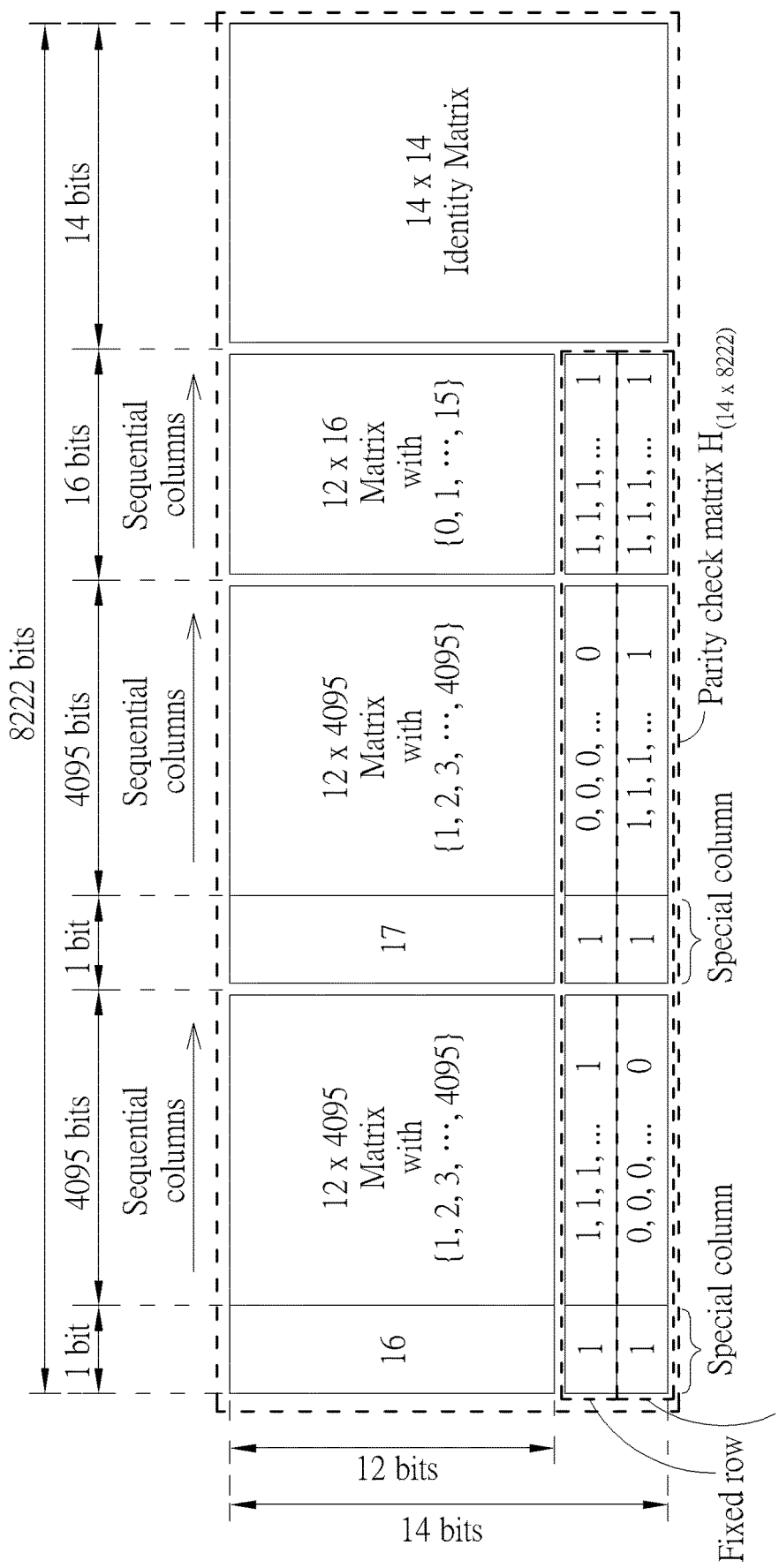
FIG. 4 illustrates a partial sequential control scheme of the data accessing method according to an embodiment of the present invention.

FIG. 4 illustrates a partial sequential control scheme of the data accessing method according to an embodiment of the present invention. The parity check matrix H mentioned above may be designed to be a parity check matrix $H_{(14 \times 8222)}$ as shown in FIG. 4, where there are 8222 columns corresponding to 8222 bits in the parity check matrix $H_{(14 \times 8222)}$, and the first 8208 columns corresponding to 8208 bits (e.g. ((1+4095)*2+16) bits=8208 bits) and the subsequent 14 columns corresponding to 14 bits within the parity check matrix $H_{(14 \times 8222)}$ may be taken as examples of the part-one matrix M and the part-two matrix K within the parity check matrix H mentioned above, respectively. Regarding a codeword format comprising data of (8192+16) bits and parity of 14 bits, the data such as the message m may have 8208 bits (e.g. (8192+16)=8208), and the parity such as the parity code p(m) corresponding to the message m may have 14 bits. The memory device 100 (e.g. the memory controller 110) may utilize the parity check matrix $H_{(14 \times 8222)}$ to perform ECC processing (e.g. ECC encoding and ECC decoding). For better comprehension, assume that the notation "$bin(DN)_{BIT\_COUNT}$" may represent the binary form of a number DN in BIT_COUNT bit width. For example, $bin(16)_{12}$=12'b000000010000. In another example, $bin(17)_{12}$=12'b000000010001.

As shown in FIG. 4, the part-two matrix K may comprise a 14×14 identity matrix such as an identity matrix $I_{(14 \times 14)}$. In addition, the part-one matrix M may comprise multiple sub-matrices having sequential columns of matrix elements respectively corresponding to sequential numbers, such as a first 12×4095 matrix with {1, 2, 3, . . . , 4095} (e.g. the column vectors thereof may indicate a binary form (or binary expression) of {1, 2, 3, . . . , 4095}, respectively), a second 12×4095 matrix with {1, 2, 3, . . . , 4095} (e.g. the column vectors thereof may indicate the binary form of {1, 2, 3, . . . , 4095}, respectively), and a 12×16 matrix with {0, 1, . . . , 15} (e.g. the column vectors thereof may indicate the binary form of {0, 1, . . . , 15}, respectively), and may further comprise one or more special columns of matrix elements and/or one or more fixed rows of matrix elements, where a combination of the above matrix elements may be taken as an example of the partial sequential information, but the present invention is not limited thereto. According to this embodiment, the one or more special columns of matrix elements may comprise a first special column {2'b11, bin(16)$_{12}$} such as {1, 1, {0, 0, 0, 0, 0, 0, 0, 1, 0, 0, 0, 0}} and a second special column {2'b11, bin(17)$_{12}$} such as {1, 1, {0, 0, 0, 0, 0, 0, 0, 1, 0, 0, 0, 1}}, and the one or more fixed rows of matrix elements may comprise a first fixed row {1, {1, 1, 1, . . . , 1}, 1, {0, 0, 0, . . . , 0}, {1, 1, 1, . . . , 1}} and a second fixed row {1, {0, 0, 0, . . . , 0}, 1, {1, 1, 1, . . . , 1}, {1, 1, 1, . . . , 1}}. Regarding the arrangement of the matrix elements in the part-one matrix $M_{(14 \times 8208)}$ of the parity check matrix $H_{(14 \times 8222)}$ shown in FIG. 4, the uppermost bit and the bottommost bit within the 12 bits corresponding to the upper 12 rows may represent a least significant bit (LSB) and a most significant bit (MSB), respectively. For example, the uppermost bit in the first special column {2'b11, bin(16)$_{12}$} should be the LSB of bin(16)$_{12}$, such as 0; the uppermost bit in the second special column {2'b11, bin(17)$_{12}$} should be the LSB of bin(17)$_{12}$, such as 1; and the rest may be deduced by analogy.

The first 12×4095 matrix with {1, 2, 3, . . . , 4095} may comprise a first set of sequential columns {bin(1)$_{12}$, bin(2)$_{12}$, bin(3)$_{12}$, bin(4095)$_{12}$} such as {{0, 0, 0, 0, 0, 0, 0, 0, 0, 0, 0, 1}, {0, 0, 0, 0, 0, 0, 0, 0, 0, 0, 1, 0}, {0, 0, 0, 0, 0, 0, 0, 0, 0, 1, 1}, . . . , {1, 1, 1, 1, 1, 1, 1, 1, 1, 1, 1, 1}} next to the upper 12 bits (e.g. bin(16)$_{12}$) in the 14 bits of the first special column {2'b11, bin(16)$_{12}$}, the second 12×4095 matrix with {1, 2, 3, . . . , 4095} may comprise a second set of sequential columns {bin(1)$_{12}$, bin(2)$_{12}$, bin(3)$_{12}$, bin(4095)$_{12}$} such as {{0, 0, 0, 0, 0, 0, 0, 0, 0, 0, 0, 1}, {0, 0, 0, 0, 0, 0, 0, 0, 0, 0, 1, 0}, {0, 0, 0, 0, 0, 0, 0, 0, 0, 0, 1, 1}, . . . , {1, 1, 1, 1, 1, 1, 1, 1, 1, 1, 1, 1}} next to the upper 12 bits (e.g. bin(17)$_{12}$) in the 14 bits of the second special column {2'b11, bin(17)$_{12}$}, and the 12×16 matrix with {0, 1, . . . , 15} may comprise a third set of sequential columns {bin(0)$_{12}$, bin(1)$_{12}$, bin(15)$_{12}$} such as {{0, 0, 0, 0, 0, 0, 0, 0, 0, 0, 0, 0}, {0, 0, 0, 0, 0, 0, 0, 0, 0, 0, 0, 1}, {0, 0, 0, 0, 0, 0, 0, 0, 1, 1, 1, 1}}.

During ECC decoding, the memory device 100 (e.g. the memory controller 110) may detect a syndrome s according to the following equation:

$$s = Hy^T;$$

where the syndrome s is typically the column index where the error bit is. More particularly, the decoding does not need a large look-up table. As some sub-matrices within the parity check matrix $H_{(14 \times 8222)}$ comprise sequential columns carrying sequential values (e.g. {1, 2, 3, . . . , 4095}, {0, 1, . . . , 15}, etc.), respectively, the internal storage space for storing pre-calculated information regarding ECC processing can be greatly reduced. For example, the look-up table can be simplified into some policies. Similarly, a generator matrix for ECC encoding can be implemented in some counters rather than a built-in large matrix. Based on the partial sequential control scheme shown in FIG. 4, the internal storage space of the HPCS type ECC circuit 115 can be implemented in a compact manner.

Figure 5:
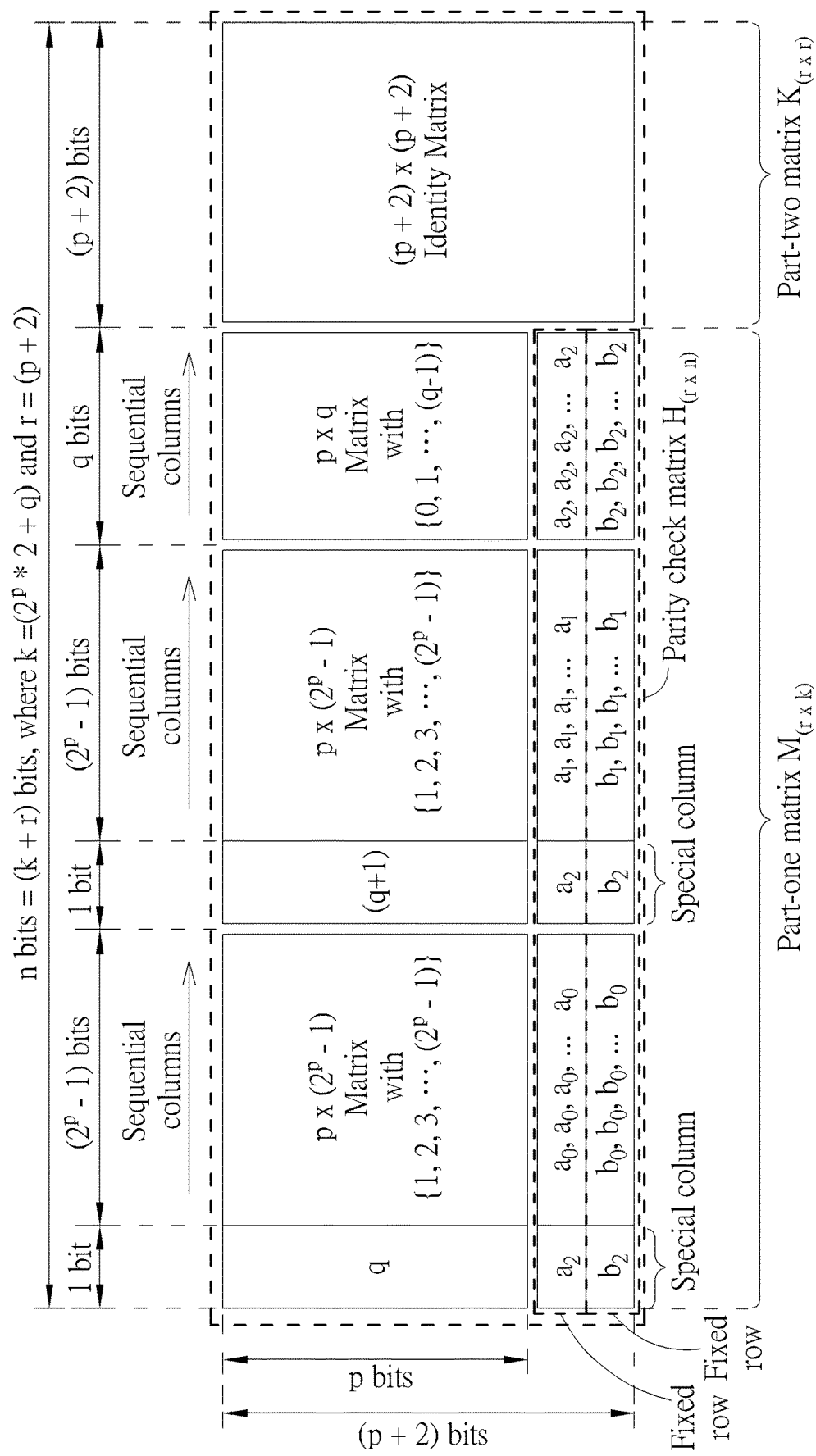
FIG. 5 illustrates the partial sequential control scheme of the data accessing method according to another embodiment of the present invention.

FIG. 5 illustrates the partial sequential control scheme of the data accessing method according to another embodiment of the present invention. The parity check matrix H mentioned above may be designed to be a parity check matrix $H_{(r \times n)}$ in a more general manner as shown in FIG. 5, where there are n columns corresponding to n bits in the parity check matrix $H_{(r \times n)}$, and the first k columns corresponding to k bits (e.g. ((1+(2$^p$−1))*2+q) bits=k bits) and the subsequent r columns corresponding to r bits (e.g. (p+2) bits=r bits) within the parity check matrix $H_{(r \times n)}$ may be taken as examples of the part-one matrix M and the part-two matrix K within the parity check matrix H mentioned above, respectively. Regarding a codeword format comprising data of (2$^p$*2+q) bits and parity of (p+2) bits, the data such as the message m may have (2$^p$*2+q) bits, and the parity such as the parity code p(m) corresponding to the message m may have (p+2) bits. The data length k, the parity length r, and the codeword length n may be expressed as follows:

$$k=(2^p*2+q);$$

$$r=(p+2); \text{ and}$$

$$n=(k+r);$$

where p and q may be positive integers, respectively, and $q \leq 2^p - 2$. The memory device 100 (e.g. the memory controller 110) may utilize the parity check matrix $H_{(r \times n)}$ to perform ECC processing (e.g. ECC encoding and ECC decoding).

As shown in FIG. 5, the part-two matrix $K_{(r \times r)}$ of the parity check matrix $H_{(r \times n)}$ may comprise a (p+2)×(p+2) identify matrix such as an identity matrix $I_{(r \times r)}$. In addition, the part-one matrix $M_{(r \times k)}$ of the parity check matrix $H_{(r \times n)}$ may comprise multiple sub-matrices having sequential columns of matrix elements respectively corresponding to sequential numbers, such as a first p×($2^p-1$) matrix with $\{1, 2, 3, \ldots, (2^p-1)\}$ (e.g. the column vectors thereof may indicate a binary form of $\{1, 2, 3, \ldots, (2^p-1)\}$, respectively), a second p×($2^p-1$) matrix with $\{1, 2, 3, \ldots, (2^p-1)\}$ (e.g. the column vectors thereof may indicate the binary form of $\{1, 2, 3, \ldots, (2^p-1)\}$, respectively), and a p×q matrix with $\{0, 1, \ldots, (q-1)\}$ (e.g. the column vectors thereof may indicate the binary form of $\{0, 1, \ldots, (q-1)\}$, respectively), and may further comprise one or more special columns of matrix elements and/or one or more fixed rows of matrix elements, where a combination of the above matrix elements may be taken as an example of the partial sequential information, but the present invention is not limited thereto. According to this embodiment, the one or more special columns of matrix elements may comprise a first special column $\{b_2, a_2, \text{bin}(q)_p\}$ and a second special column $\{b_2, a_2, \text{bin}(q+1)_p\}$, and the one or more fixed rows of matrix elements may comprise a first fixed row $\{a_2, \{a_0, a_0, a_0, \ldots, a_0\}, a_2, \{a_1, a_1, a_1, \ldots, a_1\}, \{a_2, a_2, a_2, \ldots, a_2\}\}$ and a second fixed row $\{b_2, \{b_0, b_0, b_0, \ldots, b_0\}, b_2, \{b_1, b_1, b_1, \ldots, b_1\}, \{b_2, b_2, b_2, \ldots, b_2\}\}$. In these fixed rows, $(a_{i0}, b_{i0})$ cannot be (0, 0) (e.g. i0=0, 1, or 2), and therefore, a set of matrix elements $a_{i0}$ and $b_{i0}$ at the same column in these fixed rows cannot be zero at same time. In addition, $(a_{i0}, b_{i0})$ $(a_{j0}, b_{j0})$ (e.g. i0=0, 1, or 2 and j0=0, 1, or 2, with i0≠j0), and therefore, any two set within a set of matrix elements $(a_2, b_2)$ at one column, a set of matrix elements $(a_1, b_1)$ at another column, and a set of matrix elements $(a_0, b_0)$ at yet another column in these fixed rows cannot be the same. Regarding the arrangement of the matrix elements in the part-one matrix $M_{(r \times k)}$ of the parity check matrix $H_{(r \times n)}$ shown in FIG. 5, the uppermost bit and the bit within the p bits corresponding to the upper p rows may bottommost represent LSB and MSB, respectively. For example, the uppermost bit in the first special column $\{b_2, a_2, \text{bin}(q)_p\}$ should be the LSB of $\text{bin}(q)_p$, wherein if q is an even number, this LSB is 0, otherwise, this LSB is 1; the uppermost bit in the second special column $\{b_2, a_2, \text{bin}(q+1)_p\}$ should be the LSB of $\text{bin}(q+1)_p$, wherein if q is an even number, this LSB is 1, otherwise, this LSB is 0; and the rest may be deduced by analogy.

The first p×($2^p-1$) matrix with $\{1, 2, 3, \ldots, (2^p-1)\}$ may comprise a first set of sequential columns $\{\text{bin}(1)_p, \text{bin}(2)_p, \text{bin}(3)_p, \ldots, \text{bin}(2^p-1)_p\}$ such as $\{\{0, \ldots, 0, 0, 0, 1\}, \{0, \ldots, 0, 0, 1, 0\}, \{0, \ldots, 0, 0, 1, 1\}, \ldots, \{1, \ldots, 1, 1, 1, 1\}\}$ next to the upper p bits (e.g. $\text{bin}(q)_p$) in the (p+2) bits of the first special column $\{\text{bin}(q)_p, a_2, b_2\}$, the second p×($2^p-1$) matrix with $\{1, 2, 3, \ldots, (2^p-1)\}$ may comprise a second set of sequential columns $\{\text{bin}(1)_p, \text{bin}(2)_p, \text{bin}(3)_p, \ldots, \text{bin}(2^p-1)_p\}$ such as $\{\{0, \ldots, 0, 0, 0, 1\}, \{0, \ldots, 0, 0, 1, 0\}, \{0, \ldots, 0, 0, 1, 1\}, \ldots, \{1, \ldots, 1, 1, 1, 1\}\}$ next to the upper p bits (e.g. $\text{bin}(q+1)_p$) in the (p+2) bits of the second special column $\{\text{bin}(q+1)_p, a_2, b_2\}$, and the p×q matrix with $\{0, 1, \ldots, (q-1)\}$ may comprise a third set of sequential columns $\{\text{bin}(0)_p, \text{bin}(1)_p, \text{bin}(q-1)_p\}$ such as $\{\{0, \ldots, 0, 0, 1\}, \{0, \ldots, 0, 1, 0\}, \ldots, \{0, \ldots, 0, 1, \ldots, 1\}\}$.

As some sub-matrices within the parity check matrix $H_{(r \times n)}$ comprise sequential columns carrying sequential values (e.g. $\{1, 2, 3, \ldots, (2^p-1)\}, \{0, 1, \ldots, (q-1)\}$, etc.), respectively, the internal storage space for storing pre-calculated information can be greatly reduced. For example, the look-up table can be simplified into some policies. Similarly, a generator matrix for ECC encoding can be implemented in some counters rather than a built-in large matrix. Based on the partial sequential control scheme shown in FIG. 5, the internal storage space of the HPCS type ECC circuit 115 can be implemented in a compact manner.

Figure 6:
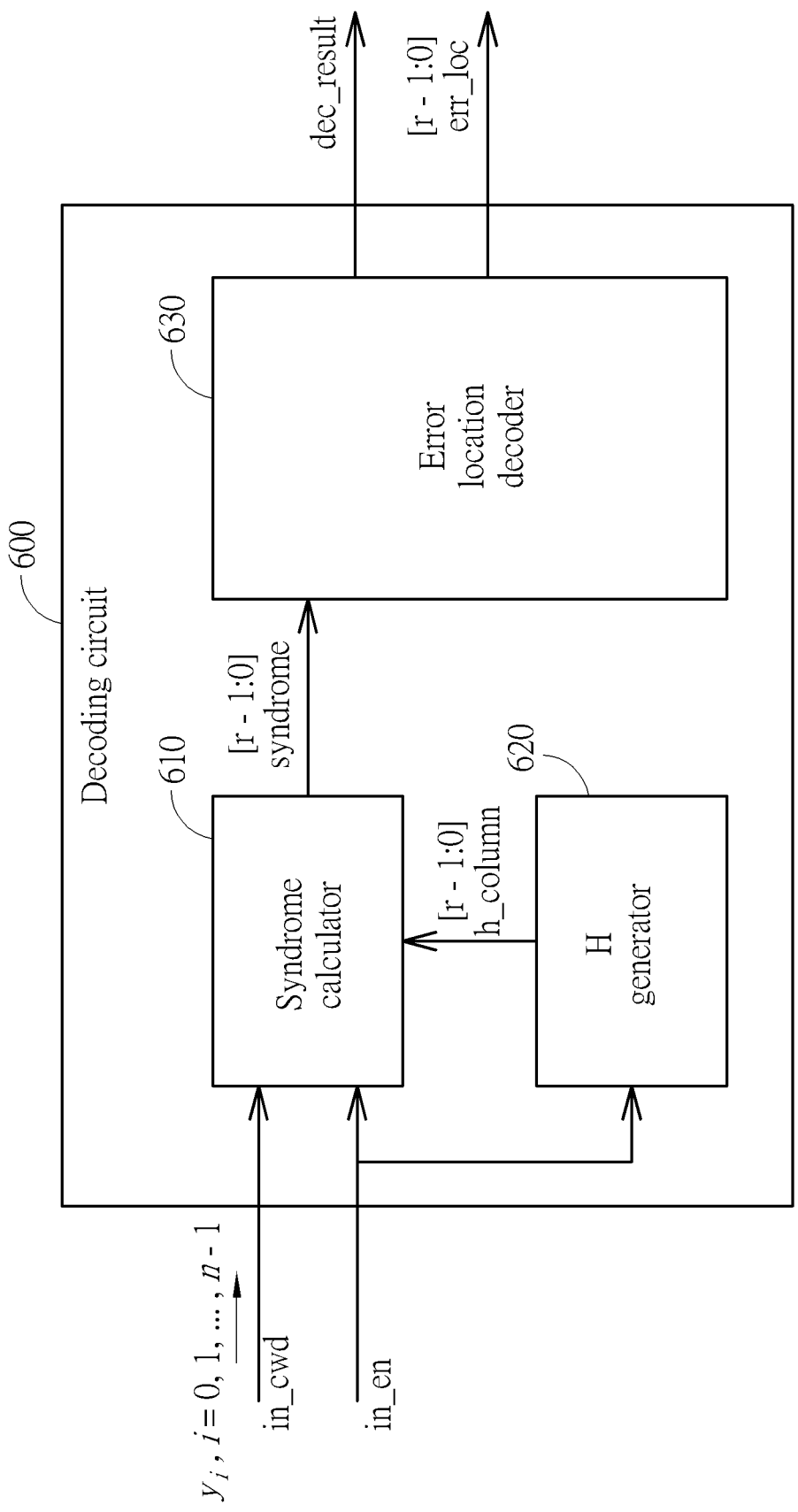
FIG. 6 is a diagram of a decoding circuit corresponding to the data accessing method according to an embodiment of the present invention.

FIG. 6 is a diagram of a decoding circuit 600 corresponding to the data accessing method according to an embodiment of the present invention. The HPCS type ECC circuit 115 may comprise at least one decoding circuit (e.g. one or more encoding circuits) such as the decoding circuit 600 shown in FIG. 6, and the decoding circuit 600 may comprise at least one decoder (e.g. one or more encoders) such as a Hamming code decoder, but the present invention is not limited thereto.

As shown in FIG. 6, the decoding circuit 600 (e.g. the aforementioned at least one decoder such as the Hamming code decoder) may comprise a syndrome calculator 610, a parity check matrix generator such as an H generator 620, and an error location decoder 630. For example, the received codeword y may be expressed as follows:

$$y=[y_0, y_1, \ldots, y_{n-1}];$$

where the decoding circuit 600 may receive the bits $\{y_i | i=0, 1, \ldots, (n-1)\}$ of the codeword y carried by an input codeword signal in_cwd, and an input width of the input codeword signal in_cwd may be equal to 1 (bit). The memory controller 110 (e.g. the HPCS type ECC circuit 115) may utilize an input enable signal in_en to enable an input function of the decoding circuit 600, to start receiving and processing the bits $\{y_i, i=0, 1, \ldots, (n-1)\}$ of the codeword y. For example, the parity check matrix generator such as the H generator 620 may generate and output a column [r−1:0] h_column of the parity check matrix $H_{(r \times n)}$, such as the r bits $\{h\_column[r-1], \ldots, h\_column[1], h\_column[0]\}$ of the column [r−1:0]h_column thereof, and the syndrome calculator 610 may receive the column [r−1:0]h_column of the parity check matrix $H_{(r \times n)}$. As a result, the parity check matrix generator such as the H generator 620 may generate all columns (e.g. the column [r−1:0]h_column) of the parity check matrix $H_{(r \times n)}$, and the syndrome calculator 610 may receive all columns (e.g. the column [r−1:0]h_column) of the parity check matrix $H_{(r \times n)}$, and may perform syndrome calculation according to the codeword y to generate and output a syndrome [r−1:0]syndrome, such as the r bits $\{\text{syndrome}[r-1], \ldots, \text{syndrome}[1], \text{syndrome}[0]\}$ of the syndrome [r−1:0]syndrome. The error location decoder 630 may receive the syndrome [r−1:0]syndrome, and may perform error detection according to the syndrome [r−1:0] syndrome to generate and output a decoding result signal dec_result, and more particularly, may perform error location decoding according to the syndrome [r−1:0]syndrome to generate and output an error location [r−1:0]err_loc. For example, the decoding result signal dec_result may carry a decoding result indicating whether any error occurs.

For better comprehension, the expression of a certain symbol starting with "[r−1:0]" (e.g. [r−1:0]h_column, [r−1:0]syndrome, [r−1:0]err_loc, etc.) may be used for declaring a bus width (e.g. r bits) according to a hardware viewpoint, but the present invention is not limited thereto. For example, assuming that r1 and r2 are non-negative integers and r1>r2), the expression of a certain symbol ending with "[r1:r2]" (e.g. syndrome[r1:r2], etc.) may be used for referring to a set of bits [r1:r2] (e.g. {syndrome[r1], syndrome[r2]}, etc.)

Figure 7:
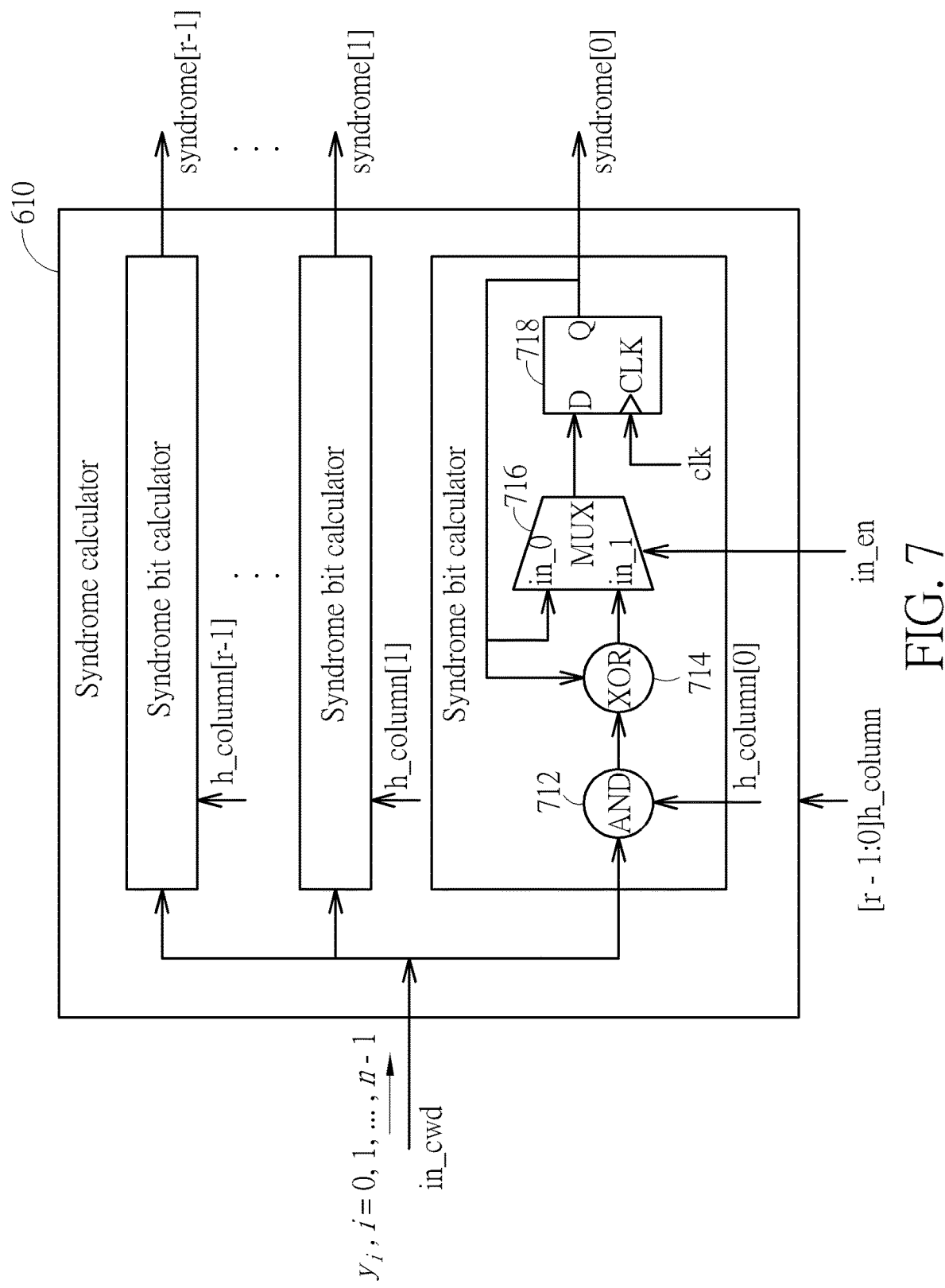
FIG. 7 illustrates some implementation details of a syndrome calculator in the decoding circuit shown in FIG. 6 according to an embodiment of the present invention.

FIG. 7 illustrates some implementation details of the syndrome calculator 610 in the decoding circuit 600 shown in FIG. 6 according to an embodiment of the present invention. The syndrome calculator 610 may comprise multiple syndrome bit calculators, and these syndrome bit calculators may have the same architecture. Regarding a syndrome bit calculator corresponding to a certain bit (e.g. the bit h_column[0]) of the column [r−1:0]h_column of the parity check matrix $H_{(r \times n)}$ shown in FIG. 5, this syndrome bit calculator may comprise an AND gate 712, an XOR gate 714, a multiplexer 716 (labeled "MUX" in FIG. 7, for brevity), and a flip-flop circuit 718 (e.g. D flip-flop). Two input terminals in_0 and in_1 of the multiplexer 716 may be coupled to an output terminal Q of the flip-flop circuit 718 and an output terminal of the XOR gate 714, respectively, and an input terminal D and a clock terminal CLK of the flip-flop circuit 718 may be coupled to an output terminal of the multiplexer 716 and a clock signal clk of the decoding circuit 600, respectively. For example, the AND gate 712 may perform an AND operation on the bit $y_i$ of the codeword y and the aforementioned certain bit (e.g. the bit h_column[0]) of the column [r−1:0]h_column to generate an AND operation result, and the XOR gate 714 may perform an XOR operation on the AND operation result and an output at the output terminal Q of the flip-flop circuit 718 to generate an XOR operation result at the output terminal thereof. In addition, the multiplexer 716 may multiplex or select one of the respective inputs of the two input terminals in_0 and in_1 of the multiplexer 716 according to the input enable signal in_en. For example, if the input enable signal in_en carries a logic value 0 for indicating a disable state (e.g. the input enable signal in_en is at a low voltage level), the multiplexer 716 may select the input of the input terminal in_0 as the output thereof; otherwise, in a situation where the input enable signal in_en carries a logic value 1 for indicating an enable state (e.g. the input enable signal in_en is at a high voltage level), the multiplexer 716 may select the input of the input terminal in_1 as the output thereof; but the present invention is not limited thereto.

Figure 8:
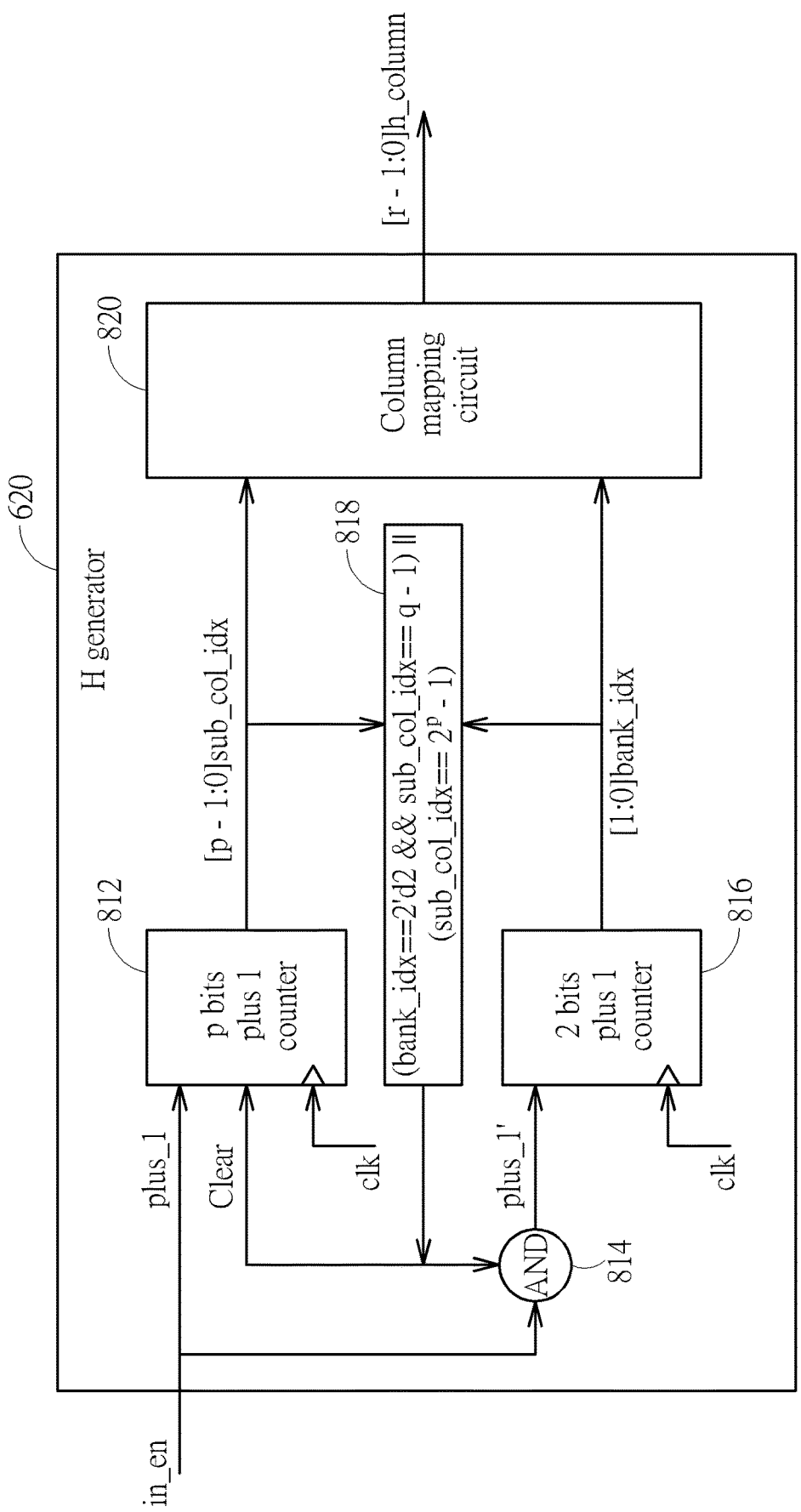
FIG. 8 illustrates some implementation details of an H generator in the decoding circuit shown in FIG. 6 according to an embodiment of the present invention.

FIG. 8 illustrates some implementation details of the H generator 620 in the decoding circuit 600 shown in FIG. 6 according to an embodiment of the present invention. The H generator 620 may comprise a p bits plus 1 counter 812, an AND gate 814, a 2 bits plus 1 counter 816, a determination circuit 818 (labeled "(bank_idx==2'd2 && sub_col_idx==q−1)||(sub_col_idx==$2^p$−1)" in FIG. 8, for better comprehension), and a column mapping circuit 820. In the following, a set of consecutive columns in the parity check matrix $H_{(r \times n)}$ may be referred to as a matrix element bank (or "bank" for brevity). For example, multiple possible values 0, 1, 2, and 3 (e.g. 2'd0, 2'd1, 2'd2, and 2'd3, respectively) of the bank index bank_idx may indicate multiple banks #0, #1, #2, and #3 within the parity check matrix $H_{(r \times n)}$ shown in FIG. 5, respectively, where the banks #0, #1, #2, and #3 may represent a set of $2^p$ columns of the parity check matrix $H_{(r \times n)}$ that start from the first special column $\{b_2, a_2, bin(q)_p\}$, another set of $2^p$ columns of the parity check matrix $H_{(r \times n)}$ that start from the second special column $\{b_2, a_2, bin(q+1)_p\}$, a set of q columns of the parity check matrix $H_{(r \times n)}$ that comprise the p×q matrix with {0, 1, ..., (q−1)}, and a set of (p+2) columns of the parity check matrix $H_{(r \times n)}$ that comprise the (p+2)×(p+2) identity matrix; and multiple possible values 0, 1, 2, etc. (e.g. 12'd0, 12'd1, 12'd2, etc. for the case of p=12, respectively) of the sub-column index sub_col_idx may indicate a series of columns in a bank of the banks #0, #1, #2, and #3 in the parity check matrix $H_{(r \times n)}$ shown in FIG. 5, respectively, where sub_col_idx=0 may indicate the leftmost column in this bank, and sub_col_idx=1, 2, etc. may indicate the subsequent columns in this bank, respectively; but the present invention is not limited thereto. In addition, the p bits plus 1 counter 812 may generate p bits {sub_col_idx[p−1], ... sub_col_idx[0]} of the sub-column index sub_col_idx, and therefore, the sub-column index sub_col_idx may be written as the sub-column index [p−1:0]sub_col_idx. Similarly, the 2 bits plus 1 counter 816 may generate 2 bits {bank_idx[1], bank_idx[0]} of the bank index bank_idx, and therefore, the bank index bank_idx may be written as the bank index [1:0]bank_idx.

Based on the architecture shown in FIG. 8, the p bits plus 1 counter 812 and the 2 bits plus 1 counter 816 may generate the sub-column index [p−1:0]sub_col_idx and the bank index [1:0]bank_idx, respectively, and the column mapping circuit 820 may perform column mapping according to the sub-column index [p−1:0]sub_col_idx and the bank index [1:0]bank_idx to convert them into the column [r−1:0]h_column of the parity check matrix $H_{(r \times n)}$ shown in FIG. 5. Each of the p bits plus 1 counter 812 and the 2 bits plus 1 counter 816 may perform a plus-one operation, and more particularly, may count according to the clock signal clk by increasing a counter value with an increment such as one, where the respective bit widths of the respective outputs of the p bits plus 1 counter 812 and the 2 bits plus 1 counter 816 may be equal to p bits and 2 bits, respectively. For example, at a moment when the H generator 620 starts operating, the respective initial values of the p bits plus 1 counter 812 and the 2 bits plus 1 counter 816 may be zero, respectively. The p bits plus 1 counter 812 may receive the input enable signal in_en as a plus-one enable signal plus_1 thereof, and may count according to the clock signal clk to generate the sub-column index [p−1:0]sub_col_idx (e.g. the p bits {sub_col_idx[p−1], ... sub_col_idx[0]} thereof) in a situation where the plus-one enable signal plus_1 such as the input enable signal in_en is in the enable state (e.g. the plus-one enable signal plus_1 is at the high voltage level). In addition, the AND gate 814 may perform an AND operation on the input enable signal in_en and the output of the determination circuit 818, to generate and output an AND operation result, and the 2 bits plus 1 counter 816 may receive the output of the AND gate 814 as a plus-one enable signal plus_1' thereof, and may count according to the clock signal clk to generate the bank index [1:0]bank_idx (e.g. the 2 bits {bank_idx[1], bank_idx[0]} thereof) in a situation where the plus-one enable signal plus_1' carrying the AND operation result is in an enable state (e.g. the plus-one enable signal plus_1' is at the high voltage level). According to this embodiment, if the clear signal Clear such as the output of the determination circuit 818 carries a logic value 1 for indicating a clear state (e.g. the clear signal Clear is at a high voltage level), the p bits plus 1 counter 812 may reset the sub-column index [p−1:0]sub_col_idx to be the initial value such as zero, where the 2 bits plus 1 counter 816 may start counting, and more particularly, count once to increase the bank index [1:0]bank_idx with an increment of one, since the plus-one enable signal plus_1' may be temporarily set as the enable state thereof; otherwise, in a situation where the clear signal Clear such as the output of the determination circuit 818 carries a logic value 0 for indicating a non-clear state (e.g. the clear signal Clear is at a low voltage level), the p bits plus 1 counter 812 may operate normally (e.g. continue counting), where the 2 bits plus 1 counter 816 may pause counting, without increasing the bank index [1:0] bank_idx, since the plus-one enable signal plus_1' may be set as the disable state thereof.

Regarding switching control between the banks #0, #1, #2, and #3, the determination circuit 818 may determine whether ((bank_idx==2'd2 && sub_col_idx==q-1)∥ (sub_col_idx==$2^p$-1)) is True or False, and more particularly, perform a calculation of ((bank_idx==2'd2 && sub_col_idx==q-1)∥(sub_col_idx==$2^p$-1)) to generate and output a corresponding logic value, such as the logic values 1 or 0 for indicating whether ((bank_idx==2'd2 && sub_col_idx==q-1)∥(sub_col_idx==$2^p$-1)) is True or False, respectively. As this logic value is utilized as the logic value of the clear signal Clear, the p bits plus 1 counter 812 may reset the sub-column index [p-1:0]sub_col_idx to be the initial value such as zero when the H generator 620 has completely generated all columns in a current bank (e.g. any of the banks #0, #1, and #2), and the H generator 620 may switch from the current bank to the next bank (e.g. one of the banks #1, #2, and #3 that is next to the current bank). For example, at a first time point when generating all columns in the bank #0 is completed, (sub_col_idx==$2^p$-1) is True, and the logic value carried by the output of the determination circuit 818 changes from 0 to 1, which may trigger switching from the bank #0 to the bank #1, where the logic value changes back to 0 afterward; at a second time point when generating all columns in the bank #1 is completed, (sub_col_idx==$2^p$-1) is True, and the logic value carried by the output of the determination circuit 818 becomes 1, which may trigger switching from the bank #1 to the bank #2, where the logic value changes back to 0 afterward; and at a third time point when generating all columns in the bank #2 is completed, (bank_idx==2'd2 && sub_col_idx==q-1) is True, and the logic value carried by the output of the determination circuit 818 becomes 1, which may trigger switching from the bank #2 to the bank #3, where the logic value changes back to 0 afterward; but the present invention is not limited thereto. As a result, during generating the columns of the current bank, the sub-column index [p-1:0] sub_col_idx may vary from 0 to a predetermined value corresponding to the current bank (e.g. ($2^p$-1) corresponding to any of the banks #0 and #1, or (q-1) corresponding to the bank #2).

As the time required for generating all columns of the parity check matrix $H_{(r \times n)}$ shown in FIG. 5 may correspond to the time period of receiving the codeword y (e.g. n cycles of the clock signal clk) or correspond to the codeword length n, the memory controller 110 (e.g. the HPCS type ECC circuit 115) may count according to the clock signal clk to determine the time point of completely generating the last column of the parity check matrix $H_{(r \times n)}$ shown in FIG. 5, and may control the input enable signal in_en to switch from the enable state to the disable state at this time point, to make the H generator 620 correctly generate and output the last column of the parity check matrix $H_{(r \times n)}$ shown in FIG. 5.

Figure 9:
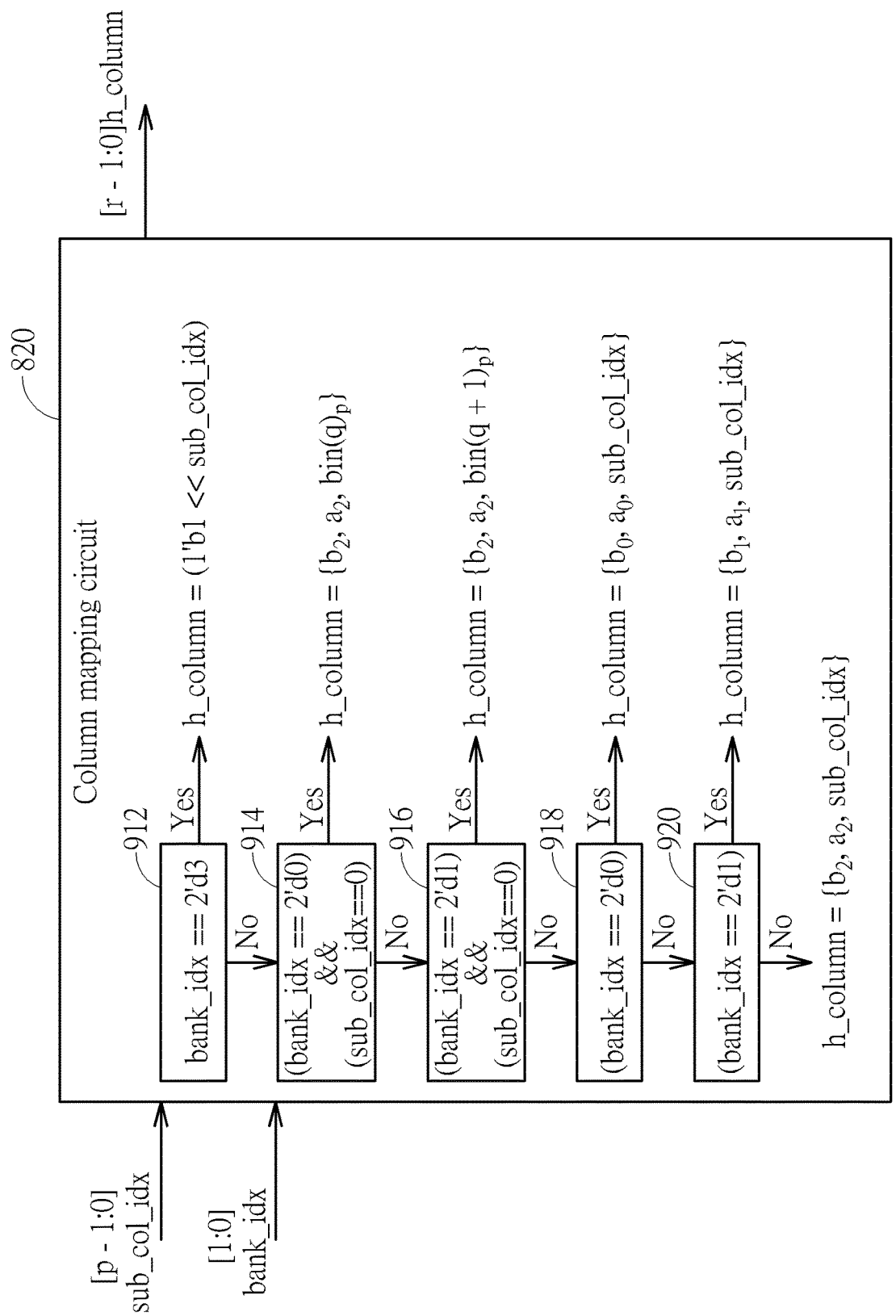
FIG. 9 illustrates some implementation details of a column mapping circuit in the H generator shown in FIG. 8 according to an embodiment of the present invention.

FIG. 9 illustrates some implementation details of the column mapping circuit 820 in the H generator 620 shown in FIG. 8 according to an embodiment of the present invention. The column mapping circuit 820 may comprise multiple determination circuits 912, 914, 916, 918, and 920 (respectively labeled "bank_idx==2'd3", "(bank_idx==2'd0) && (sub_col_idx==0)", "(bank_idx==2'd1) && (sub_col_idx==0)", "(bank_idx==2'd0)", and "(bank_idx==2'd1)" in FIG. 9, for better comprehension), and these determination circuits 912, 914, 916, 918, and 920 may be implemented with logic circuits, respectively, but the present invention is not limited thereto. Based on the architecture shown in FIG. 9, the column mapping circuit 820 may perform column mapping on one or more indexes of the bank index [1:0]bank_idx and the sub-column index [p-1:0]sub_col_idx to convert the one or more indexes into the column [r-1:0]h_column of the parity check matrix $H_{(r \times n)}$ shown in FIG. 5.

For example, the determination circuit 912 may determine whether (bank_idx==2'd3) is True or False, and more particularly, perform a calculation of (bank_idx==2'd3) to generate and output a corresponding logic value, such as the logic values 1 or 0 for indicating whether (bank_idx==2'd3) is True or False, respectively, wherein if this logic value is the logic value 1 (e.g. the case of "Yes" corresponding to the logic value 1), the determination circuit 912 may trigger the column mapping circuit 820 to output (1'b1<<sub_col_idx) as the column [r-1:0]h_column (labeled "h_column= (1'b1<<sub_col_idx)" in FIG. 9, for brevity), otherwise (e.g. the case of "No" corresponding to the logic value 0), the determination circuit 912 may trigger a determination operation of the determination circuit 914; the determination circuit 914 may determine whether ((bank_idx==2'd0) && (sub_col_idx==0)) is True or False, and more particularly, perform a calculation of ((bank_idx==2'd0) && (sub_col_idx==0)) to generate and output a corresponding logic value, such as the logic values 1 or 0 for indicating whether ((bank_idx==2'd0) && (sub_col_idx==0)) is True or False, respectively, wherein if this logic value is the logic value 1 (e.g. the case of "Yes" corresponding to the logic value 1), the determination circuit 914 may trigger the column mapping circuit 820 to output the first special column {$b_2$, $a_2$, bin$(q)_p$} as the column [r-1:0]h_column (labeled "h_column={$b_2$, $a_2$, bin$(q)_p$}" in FIG. 9, for brevity), otherwise (e.g. the case of "No" corresponding to the logic value 0), the determination circuit 914 may trigger a determination operation of the determination circuit 916; the determination circuit 916 may determine whether ((bank_idx==2'd1) && (sub_col_idx==0)) is True or False, and more particularly, perform a calculation of ((bank_idx==2'd1) && (sub_col_idx==0)) to generate and output a corresponding logic value, such as the logic values 1 or 0 for indicating whether ((bank_idx==2'd1) && (sub_col_idx==0)) is True or False, respectively, wherein if this logic value is the logic value 1 (e.g. the case of "Yes" corresponding to the logic value 1), the determination circuit 916 may trigger the column mapping circuit 820 to output the second special column {$b_2$, $a_2$, bin$(q+1)_p$} as the column [r-1:0]h_column (labeled "h_column={$b_2$, $a_2$, bin$(q+1)_p$}" in FIG. 9, for brevity), otherwise (e.g. the case of "No" corresponding to the logic value 0), the determination circuit 916 may trigger a determination operation of the determination circuit 918; the determination circuit 918 may determine whether (bank_idx==2'd0) is True or False, and more particularly, perform a calculation of (bank_idx==2'd0) to generate and output a corresponding logic value, such as the logic values 1 or 0 for indicating whether (bank_idx==2'd0) is True or False, respectively, wherein if this logic value is the logic value 1 (e.g. the case of "Yes" corresponding to the logic value 1), the determination circuit 918 may trigger the column mapping circuit 820 to output a partial sequential column {$)_0$, $a_0$, sub_col_idx} as the column [r-1:0]h_column (labeled "h_column={$b_0$, $a_0$, sub_col_idx}" in FIG. 9, for brevity), otherwise (e.g. the case of "No" corresponding to the logic value 0), the determination circuit 918 may trigger a determination operation of the determination circuit 920; and the determination circuit 920 may determine whether (bank_idx==2'd1) is True or False, and more particularly, perform a calculation of (bank_idx==2'd1) to generate and output a corresponding logic value, such as the logic values 1 or 0 for indicating whether (bank_idx==2'd1) is True or False, respectively, wherein if this logic value is the logic value 1 (e.g. the case of "Yes" corresponding to the logic value 1), the determination circuit 920 may trigger the column mapping circuit 820 to output a partial sequential column {$b_1$, $a_1$, sub_col_idx} as the column [r−1:0]h_column (labeled "h_column={$b_1$, $a_1$, sub_col_idx}" in FIG. 9, for brevity), otherwise (e.g. the case of "No" corresponding to the logic value 0), the determination circuit 920 may trigger the column mapping circuit 820 to output a partial sequential column {$b_2$, $a_2$, sub_col_idx} as the column [r−1:0]h_column (labeled "h_column={$b_2$, $a_2$, sub_col_idx}" in FIG. 9, for brevity).

According to some embodiments, the column mapping circuit 820 may comprise a shifter, and may utilize the shifter to shift the value 1'b1 (e.g. perform left-shifting on the value 1'b1) sub_col_idx times to generate (1'b1<<sub_col_idx). In addition, the column mapping circuit 820 may store the first special column {$b_2$, $a_2$, bin(q)$_p$} and the second special column {$b_2$, $a_2$, bin(q+1)$_p$} in a storage unit in the column mapping circuit 820, for being retrieved by the column mapping circuit 820 when needed.

Figure 10:
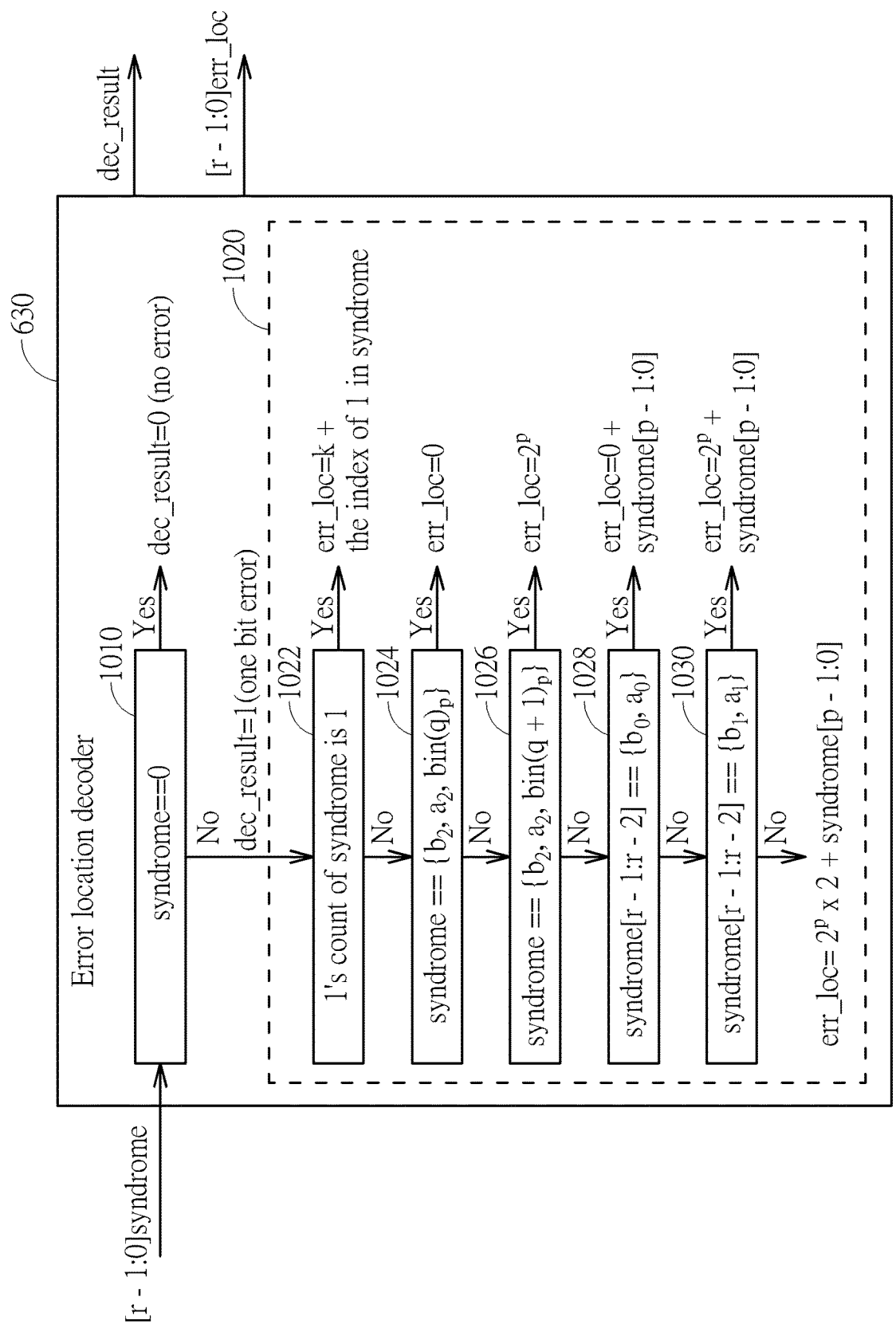
FIG. 10 illustrates some implementation details of an error location decoder in the decoding circuit shown in FIG. 6 according to an embodiment of the present invention.

FIG. 10 illustrates some implementation details of the error location decoder 630 in the decoding circuit 600 shown in FIG. 6 according to an embodiment of the present invention. The error location decoder 630 may comprise multiple determination circuits 1010, 1022, 1024, 1026, 1028, and 1030 (respectively labeled "syndrome==0", "1's count of syndrome is 1", "syndrome {$b_2$, $a_2$, bin(q)$_p$}", "syndrome {$b_2$, $a_2$, bin(q+1)$_p$}", "syndrome[r−1:r−2]=={$b_0$, $a_0$}", and "syndrome[r−1:r−2] {$b_1$, $a_1$}" in FIG. 10, for better comprehension), and these determination circuits 1010, 1022, 1024, 1026, 1028, and 1030 may be implemented with logic circuits, respectively, where the sub-circuit 1020 may be regarded as an error locator, but the present invention is not limited thereto. Based on the architecture shown in FIG. 9, the error location decoder 630 may decode the syndrome [r−1:0]syndrome to generate the decoding result signal dec_result carrying the decoding result, and more particularly, may perform error location decoding on the syndrome [r−1:0]syndrome, to determine the error location [r−1:0]err_loc of the error such as a one bit error.

For example, the determination circuit 1010 may determine whether (syndrome==0) is True or False, and more particularly, perform a calculation of (syndrome==0) to generate and output a corresponding logic value, such as the logic values 1 or 0 for indicating whether (syndrome==0) is True or False, respectively, wherein if this logic value is the logic value 1 (e.g. the case of "Yes" corresponding to the logic value 1), the determination circuit 1010 may trigger the error location decoder 630 to output the decoding result signal dec_result carrying the decoding result of no error (labeled "dec_result=0" in FIG. 10, for brevity), otherwise (e.g. the case of "No" corresponding to the logic value 0), the determination circuit 1010 may trigger the error location decoder 630 to output the decoding result signal dec_result carrying the decoding result of error such as one bit error (labeled "dec_result=1" in FIG. 10, for brevity), and may trigger a determination operation of the determination circuit 1022; assuming that the symbol 1s_count of syndrome represents the 1's count of the syndrome [r−1:0]syndrome (e.g. the number of bits each having the value 1 in the r bits {syndrome[r−1], . . . , syndrome[1], syndrome[0]} of the syndrome [r−1:0]syndrome), the determination circuit 1022 may determine whether (1s_count of syndrome==1) is True or False, and more particularly, perform a calculation of (1s_count of syndrome==1) to generate and output a corresponding logic value, such as the logic values 1 or 0 for indicating whether (1s_count of syndrome==1) is True or False, respectively, wherein if this logic value is the logic value 1 (e.g. the case of "Yes" corresponding to the logic value 1), the determination circuit 1022 may trigger the error location decoder 630 to output k plus the index of 1 in the syndrome [r−1:0]syndrome, such as the summation (k+r0) of the data length k and the index r0 of the bit syndrome[r0] having the value 1 in the r bits {syndrome[r−1], . . . , syndrome[1], syndrome[0]} of the syndrome [r−1:0]syndrome (e.g. r0 may be an integer in the interval [0, r−1]), as the error location [r−1:0]err_loc (labeled "err_loc=k+the index of 1 in syndrome" in FIG. 10, for brevity), otherwise (e.g. the case of "No" corresponding to the logic value 0), the determination circuit 1022 may trigger a determination operation of the determination circuit 1024; the determination circuit 1024 may determine whether (syndrome {$b_2$, $a_2$, bin(q)$_p$}) is True or False, and more particularly, perform a calculation of (syndrome {$b_2$, $a_2$, bin(q)$_p$}) to generate and output a corresponding logic value, such as the logic values 1 or 0 for indicating whether (syndrome {$b_2$, $a_2$, bin(q)$_p$}) is True or False, respectively, wherein if this logic value is the logic value 1 (e.g. the case of "Yes" corresponding to the logic value 1), the determination circuit 1024 may trigger the error location decoder 630 to output 0 as the error location [r−1:0]err_loc (labeled "err_loc=0" in FIG. 10, for brevity), otherwise (e.g. the case of "No" corresponding to the logic value 0), the determination circuit 1024 may trigger a determination operation of the determination circuit 1026; the determination circuit 1026 may determine whether (syndrome=={$b_2$, $a_2$, bin(q+1)$_p$}) is True or False, and more particularly, perform a calculation of (syndrome {$b_2$, $a_2$, bin(q+1)$_p$}) to generate and output a corresponding logic value, such as the logic values 1 or 0 for indicating whether (syndrome=={$b_2$, $a_2$, bin(q+1)$_p$}) is True or False, respectively, wherein if this logic value is the logic value 1 (e.g. the case of "Yes" corresponding to the logic value 1), the determination circuit 1026 may trigger the error location decoder 630 to output $2^P$ as the error location [r−1:0]err_loc (labeled "err_loc=$2^P$" in FIG. 10, for brevity), otherwise (e.g. the case of "No" corresponding to the logic value 0), the determination circuit 1026 may trigger a determination operation of the determination circuit 1028; the determination circuit 1028 may determine whether (syndrome[r−1:r−2]=={1}$_0$, $a_0$}) is True or False, and more particularly, perform a calculation of (syndrome[r−1:r−2]=={$b_0$, $a_0$}) to generate and output a corresponding logic value, such as the logic values 1 or 0 for indicating whether (syndrome[r−1:r−2] {$b_0$, $a_0$}) is True or False, respectively, wherein if this logic value is the logic value 1 (e.g. the case of "Yes" corresponding to the logic value 1), the determination circuit 1028 may trigger the error location decoder 630 to output (0+syndrome[p−1:0]) (e.g. syndrome[p−1:0]) as the error location [r−1:0]err_loc (labeled "err_loc=0+syndrome[p−1:0]" in FIG. 10, for brevity), otherwise (e.g. the case of "No" corresponding to the logic value 0), the determination circuit 1028 may trigger a determination operation of the determination circuit 1030; and the determination circuit 1030 may determine whether (syndrome[r−1:r−2]=={b$_1$, a$_1$}) is True or False, and more particularly, perform a calculation of (syndrome[r−1:r−2]=={b$_1$, a$_1$}) to generate and output a corresponding logic value, such as the logic values 1 or 0 for indicating whether (syndrome[r−1:r−2]=={b$_1$, a$_1$}) is True or False, respectively, wherein if this logic value is the logic value 1 (e.g. the case of "Yes" corresponding to the logic value 1), the determination circuit 1030 may trigger the error location decoder 630 to output ($2^P$+syndrome[p−1:0]) as the error location [r−1:0]err_loc (labeled "err_loc=$2^P$+syndrome[p−1:0]" in FIG. 10, for brevity), otherwise (e.g. the case of "No" corresponding to the logic value 0), the determination circuit 1028 may trigger the error location decoder 630 to output (($2^P*2$)+syndrome[p−1:0])) as the error location [r−1:0]err_loc (labeled "err_loc=$2^P$×2+syndrome[p−1:0]" in FIG. 10, for brevity).

According to some embodiments, as the error location [r−1:0]err_loc may indicate the location of the one bit error, the decoding circuit 600 may perform error correction on the one bit error at this location according to the remaining bits within the codeword y, but the present invention is not limited thereto.

Figure 11:
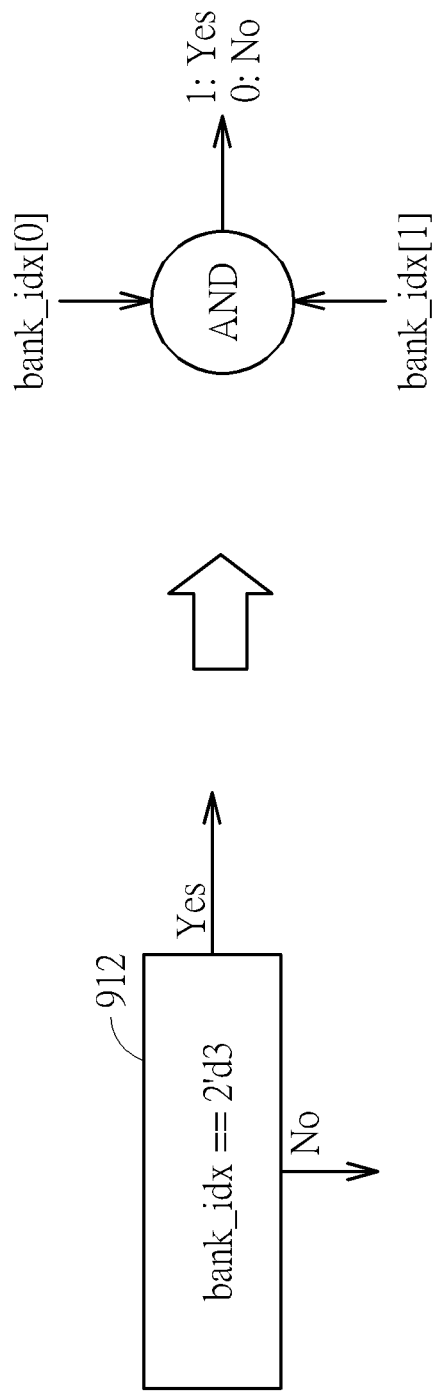
FIG. 11 illustrates an example of a determination circuit in the column mapping circuit shown in FIG. 9.

FIG. 11 illustrates an example of the determination circuit 912 in the column mapping circuit 820 shown in FIG. 9. The determination circuit 912 may comprise an AND gate, and the AND gate may perform an AND operation on the 2 bits {bank_idx[1], bank_idx[0]} of the bank index bank_idx, to generate and output an AND operation result, for example, a corresponding logic value, such as the logic values 1 or 0 for indicating whether (bank_idx[1] bank_idx[0]) is True or False, respectively, wherein if this logic value is the logic value 1 (e.g. the case of "Yes" corresponding to the logic value 1), the determination circuit 912 may trigger the column mapping circuit 820 to output (1'b1<<sub_col_idx) as the column [r−1:0]h_column, otherwise (e.g. the case of "No" corresponding to the logic value 0), the determination circuit 912 may trigger the determination operation of the determination circuit 914. For brevity, similar descriptions for this embodiment are not repeated in detail here.

Figure 12:
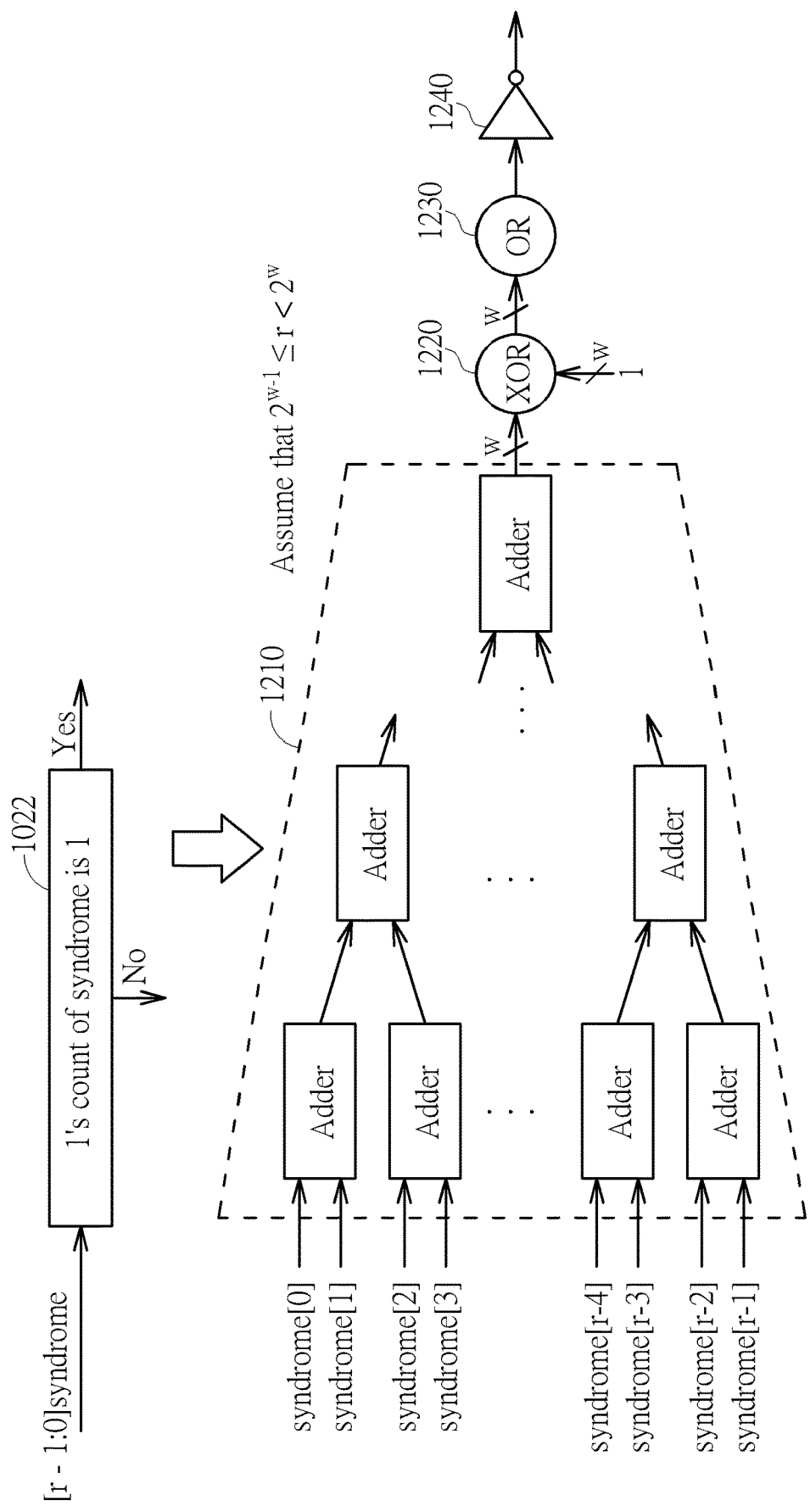
FIG. 12 illustrates an example of a determination circuit in the error location decoder shown in FIG. 10.

FIG. 12 illustrates an example of the determination circuit 1022 in the error location decoder 630 shown in FIG. 10. Assume that $2^{w-1} \leq r \leq 2^w$. The determination circuit 1022 may comprise an adder module 1210 comprising multiple adders (e.g. w-bit adders), a bitwise XOR module 1220 comprising w XOR gates, an OR gate module 1230 comprising multiple OR gates, and an inverter 1240. These adders of the adder module 1210, such as the w-bit adders, may be implemented to be multiple columns of adders as shown in FIG. 12, for adding all bits of the syndrome [r−1:0]syndrome to generate a w-bit output of the adder module 1210 (e.g. the summation of all w-bit inputs of the adder module 1210), where each of the r bits {syndrome[0], syndrome[0]}, {syndrome[2], syndrome[3]}, . . . , {syndrome[r−4], syndrome[r−3]}, and {syndrome[r−2], syndrome[r−1]} of the syndrome [r−1:0]syndrome may be received as an LSB in w bits of an input of one of the adders (e.g. any of the first column of adders shown in the left hand side of FIG. 12), with remaining bits of the w bits being zero, but the present invention is not limited thereto. As long as adding all bits of the syndrome [r−1:0]syndrome can be carried out, the arrangement of the adders of the adder module 1210 may vary. In addition, the w XOR gates of the bitwise XOR module 1220 may be implemented to be a column of XOR gates, for receiving the w-bit output of the adder module 1210 and performing a bitwise XOR operation on the w-bit output of the adder module 1210 and 1 (e.g. w' d1, such as a set of w bits carrying a decimal value 1, with an LSB of 1 and remaining bits of 0), to generate a w-bit output of the bitwise XOR module 1220. Additionally, the OR gates of the OR gate module 1230 may be implemented to be multiple columns of OR gates in a similar arrangement as that of the adders of the adder module 1210, for performing OR operations on all bits of the w-bit output of the bitwise XOR module 1220 to generate an OR operation result, where each of the w bits of this w-bit output may be received as an input of one of the OR gates, but the present invention is not limited thereto. As long as performing the OR operations on all bits of the w-bit output of the bitwise XOR module 1220 can be carried out, the arrangement of the OR gates of the OR gate module 1230 may vary. As shown in FIG. 12, the inverter 1240 may invert the OR operation result to generate the corresponding logic value of determination circuit 1022. For brevity, similar descriptions for this embodiment are not repeated in detail here.

Figure 13:
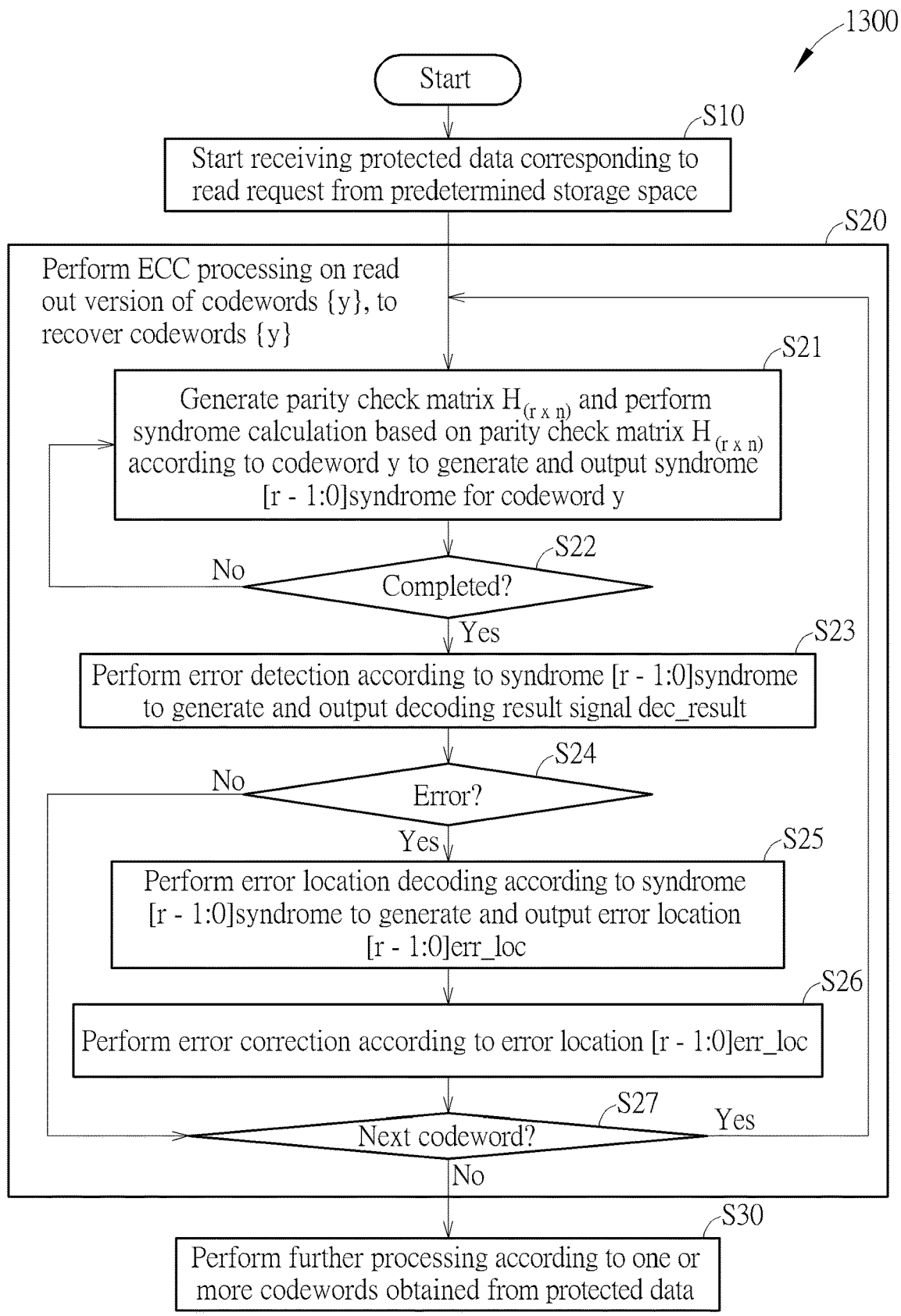
FIG. 13 illustrates a working flow of the data accessing method according to an embodiment of the present invention.

FIG. 13 illustrates a working flow 1300 of the data accessing method according to an embodiment of the present invention. The memory controller 110 may trigger operations of the working flow 1300 according to a read request of reading protected data (e.g. ECC protected data, such as the codewords {y}) from predetermined storage space, where the predetermined storage space is typically accessible by the memory controller 110. For example, the read request may represent an external request of the memory device 100, such as a host command (e.g. a read command) from the host device 50, and the predetermined storage space may represent internal storage space of the memory device 100, such as the storage space within the NV memory 120. In another example, the read request may represent an internal request of the memory device 100, and the predetermined storage space may represent the external storage space of the memory device 100, such as the portion of memory space of the host device 50 as mentioned in some embodiments described above.

In Step S10, in response to the read request, the memory controller 110 may start receiving the protected data corresponding to the read request from the predetermined storage space, where the protected data may comprise a read out version of one or more codewords (e.g. the codewords {y}) comprising the codeword y, such as the read out version of the codewords {y}. According to this embodiment, if no error occurs, the read out version of one or more codewords such as the codewords {y} is supposed to be equal to the codewords {y} for the case of no error; otherwise, the read out version of the codewords {y} may be an altered version of the codewords {y}, where the codewords {y} may be recoverable according to the read out version of the codewords {y}.

In Step S20, the memory controller 110 may utilize the HPCS type ECC circuit 115 (e.g. the decoding circuit 600) to perform ECC processing (e.g. ECC decoding) on the read out version of the codewords {y}, to recover the codewords {y}.

In Step S21, regarding the codeword y (e.g. any of the codewords {y} mentioned in Step S20), the HPCS type ECC circuit 115 (e.g. the decoding circuit 600) may generate the parity check matrix $H_{(r \times n)}$, for example, column by column, and perform syndrome calculation based on the parity check matrix $H_{(r \times n)}$ according to the codeword y to generate and output the syndrome [r−1:0]syndrome for the codeword y. More particularly, the parity check matrix generator such as the H generator 620 may generate the parity check matrix $H_{(r \times n)}$, and the syndrome calculator 610 may perform the syndrome calculation based on the parity check matrix $H_{(r \times n)}$ according to the codeword y to generate and output the syndrome [r−1:0] syndrome for the codeword y. As shown in FIG. 5, the part-one matrix $M_{(r \times k)}$ of the parity check matrix $H_{(r \times n)}$ may comprise the first special column $\{b_2, a_2, \text{bin}(q)_p\}$, the second special column $\{b_2, a_2, \text{bin}(q+1)_p\}$, and multiple sub-matrices having sequential columns of matrix elements respectively corresponding to sequential numbers, such as the first $p \times (2^p-1)$ matrix with $\{1, 2, 3, \ldots, (2^p-1)\}$, the second $p \times (2^p-1)$ matrix with $\{1, 2, 3, \ldots, (2^p-1)\}$, and the p×q matrix with $\{0, 1, \ldots, (q-1)\}$. More particularly, the first special column $\{b_2, a_2, \text{bin}(q)_p\}$ carries a first predetermined value $\text{bin}(q)_p$ with a first portion of matrix elements (e.g. the upper p matrix elements in the upper p rows, such as the p bits in the upper p rows) in the first special column $\{b_2, a_2, \text{bin}(q)_p\}$, and the second special column $\{b_2, a_2, \text{bin}(q+1)_p\}$ carries a second predetermined value $\text{bin}(q+1)_p$ with a second portion of matrix elements (e.g. the upper p matrix elements in the upper p rows, such as the p bits in the upper p rows) in the second special column $\{b_2, a_2, \text{bin}(q+1)_p\}$, wherein the last two rows of the part-one matrix $M_{(r \times k)}$ are fixed rows respectively carrying two sets of predetermined bits (e.g. the first fixed row $\{a_2, \{a_0, a_0, a_0, \ldots, a_0\}, a_2, \{a_1, a_1, a_1, \ldots, a_1\}, \{a_2, a_2, a_2, \ldots, a_2\}\}$ and the second fixed row $\{b_2, \{b_0, b_0, b_0, \ldots, b_0\}, b_2, \{b_1, b_1, b_1, \ldots, b_1\}, \{b_2, b_2, b_2, \ldots, b_2\}\}$), and the first portion of matrix elements and the second portion of matrix elements are in remaining rows of the part-one matrix $M_{(r \times k)}$ of the parity check matrix $H_{(r \times n)}$. Additionally, the part-two matrix $K_{(r \times r)}$ of the parity check matrix $H_{(r \times n)}$ may comprise the (p+2)×(p+2) identity matrix such as the identity matrix $I_{(r \times r)}$.

In Step S22, regarding this codeword y, the HPCS type ECC circuit 115 (e.g. the decoding circuit 600) may determine whether the operations of Step S21 are completed. If Yes (e.g. all columns of the parity check matrix $H_{(r \times n)}$ have been generated, and therefore the syndrome [r−1:0]syndrome has been generated), Step S23 is entered; if No (e.g. one or more columns of the parity check matrix $H_{(r \times n)}$ have not been generated), Step S21 is entered to continue these operations.

In Step S23, regarding this codeword y, the HPCS type ECC circuit 115 (e.g. the decoding circuit 600, and more particularly, the error location decoder 630) may perform the error detection according to the syndrome [r−1:0]syndrome to generate and output the decoding result signal dec_result.

In Step S24, regarding this codeword y, the HPCS type ECC circuit 115 (e.g. the decoding circuit 600, and more particularly, the error location decoder 630) may determine whether any error occurs, as indicated by the decoding result signal dec_result. If Yes (e.g. the error location decoder 630 outputs the decoding result signal dec_result carrying the decoding result of error), Step S25 is entered; if No (e.g. the error location decoder 630 outputs the decoding result signal dec_result carrying the decoding result of no error), Step S27 is entered.

In Step S25, regarding this codeword y, the HPCS type ECC circuit 115 (e.g. the decoding circuit 600, and more particularly, the error location decoder 630) may perform the error location decoding according to the syndrome [r−1:0] syndrome to generate and output the error location [r−1:0] err_loc.

In Step S26, regarding this codeword y, the HPCS type ECC circuit 115 (e.g. the decoding circuit 600) may perform error correction of the codeword y, to correct the error at the error location [r−1:0]err_loc of the codeword y, for example, according to respective bits at some other locations of the codeword y, and therefore recover the codeword y.

In Step S27, the HPCS type ECC circuit 115 (e.g. the decoding circuit 600) may determine whether processing a next codeword is required. When processing the next codeword is required, Step S21 is entered; otherwise, Step S30 is entered.

In Step S30, the memory device 100 (e.g. the memory controller 110) may perform further processing according to the one or more codewords (e.g. the codewords $\{y\}$) obtained from the protected data. For example, in a situation where the read request represents the external request of the memory device 100, such as the host command (e.g. the read command) from the host device 50, the memory controller 110 may return the one or more codewords such as the codewords $\{y\}$ to the host device 50. In another example, in a situation where the read request represents the internal request of the memory device 100, the memory controller 110 may utilize the one or more codewords such as the codewords $\{y\}$ to perform one or more other operations of the memory device 100, such as an operation of determining whether a quick reference information sent from the host device 50 has been intentionally or unintentionally altered (e.g. tampered), where the quick reference information may be used as quick reference for accessing operations within the memory device 100 to enhance the overall performance, but the present invention is not limited thereto.

According to this embodiment, one of the multiple sub-matrices of the part-one matrix $M_{(r \times k)}$, such as the first $p \times (2^p-1)$ matrix with $\{1, 2, 3, \ldots, (2^p-1)\}$, may comprise the first set of sequential columns $\{\text{bin}(1)_p, \text{bin}(2)_p, \text{bin}(3)_p, \text{bin}(2^p-1)_p\}$ next to the first portion of matrix elements (e.g. the upper p matrix elements in the upper p rows), and another of the multiple sub-matrices of the part-one matrix $M_{(r \times k)}$, such as the second $p \times (2^p-1)$ matrix with $\{1, 2, 3, \ldots, (2^p-1)\}$, may comprise the second set of sequential columns $\{\text{bin}(1)_p, \text{bin}(2)_p, \text{bin}(3)_p, \ldots, \text{bin}(2^p-1)_p\}$ next to the second portion of matrix elements (e.g. the upper p matrix elements in the upper p rows). Additionally, yet another of the multiple sub-matrices of the part-one matrix $M_{(r \times k)}$, such as the p×q matrix with $\{0, 1, \ldots, (q-1)\}$, may comprise the third set of sequential columns $\{\text{bin}(0)_p, \text{bin}(1)_p, \ldots, \text{bin}(q-1)_p\}$. For brevity, similar descriptions for this embodiment are not repeated in detail here.

For better comprehension, the data accessing method may be illustrated with the working flow 1300 shown in FIG. 13, but the present invention is not limited thereto. According to some embodiments, one or more steps may be added, deleted, or changed in the working flow 1300 shown in FIG. 13.

According to some embodiments, each matrix element of the parity check matrix $H_{(r \times n)}$ indicates a bit of information, and for each column of the parity check matrix $H_{(r \times n)}$, the lower two matrix elements correspond to two bits, and remaining matrix elements such as upper p matrix elements correspond to p bits. More particularly, the one of the multiple sub-matrices of the part-one matrix $M_{(r \times k)}$, such as the first $p \times (2^p-1)$ matrix with $\{1, 2, 3, \ldots, (2^p-1)\}$, may comprise the first set of sequential columns $\{\text{bin}(1)_p, \text{bin}(2)_p, \text{bin}(3)_p, \text{bin}(2^p-1)_p\}$ next to the upper p bits (e.g. $\text{bin}(q)_p$) in the (p+2) bits of the first special column $\{\text{bin}(q)_p, a_2, b_2\}$. In addition, the other of the multiple sub-matrices of the part-one matrix $M_{(r \times k)}$, such as the second $p \times (2^p-1)$ matrix with $\{1, 2, 3, \ldots, (2^p-1)\}$, may comprise the second set of sequential columns $\{\text{bin}(1)_p, \text{bin}(2)_p, \text{bin}(3)_p, \text{bin}(2^p-1)_p\}$ next to the upper p bits (e.g. $\text{bin}(q+1)_p$) in the (p+2) bits of the second special column $\{\text{bin}(q+1)_p, a_2, b_2\}$. For brevity, similar descriptions for these embodiments are not repeated in detail here.

According to some embodiments, in any of the multiple sub-matrices of the part-one matrix $M_{(r \times k)}$, a set of sequential columns carrying sequential values are sequentially generated according to the aforementioned policies by the decoding circuit 600 (e.g. the parity check matrix generator such as the H generator 620) during ECC processing (e.g. ECC decoding), rather than being stored in the decoding circuit 600 in advance before the ECC processing, whereby internal storage space for storing pre-calculated information regarding the ECC processing within the memory controller 110 can be saved. For brevity, similar descriptions for these embodiments are not repeated in detail here.

According to some embodiments, the first special column $\{b_2, a_2, \text{bin}(q)_p\}$, the second special column $\{b_2, a_2, \text{bin}(q+1)_p\}$, and the fixed rows are arranged to make any two columns of the parity check matrix $H_{(r \times n)}$ be different from each other and make each column of the parity check matrix $H_{(r \times n)}$ be non-zero, whereby malfunction of the memory controller 110 can be prevented. For brevity, similar descriptions for these embodiments are not repeated in detail here.

According to some embodiments, in response to a write request, the memory controller 110 may utilize the encoding circuit 200 to generate the protected data according to the parity check matrix $H_{(r \times n)}$, for example, by encoding the plurality of messages $\{m\}$ according to the parity check matrix $H_{(r \times n)}$ to generate the plurality of parity codes $\{p(m)\}$ corresponding to the plurality of messages $\{m\}$ and combining them into the codewords $\{y\}$, and to write the protected data into the predetermined storage space, where the write request is a request before the read request. For brevity, similar descriptions for these embodiments are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A data accessing method using data protection with aid of a parity check matrix having partial sequential information, the data accessing method being applicable to a memory controller of a memory device, the memory device comprising the memory controller and a non-volatile (NV) memory, the NV memory comprising at least one NV memory element, the data accessing method comprising:

in response to a read request, utilizing the memory controller to start receiving protected data corresponding to the read request from predetermined storage space;

utilizes a decoding circuit within the memory controller to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix;

utilizing the decoding circuit to perform syndrome calculation based on the parity check matrix according to a codeword to generate and output a syndrome for the codeword, wherein the protected data comprises a read out version of one or more codewords comprising the codeword;

utilizing the decoding circuit to perform error detection according to the syndrome to generate and output a decoding result signal, and perform error location decoding according to the syndrome to generate and output an error location;

utilizing the decoding circuit to perform error correction of the codeword, to correct an error at the error location of the codeword, in order to recover the codeword; and utilizing the memory controller to perform further processing according to the one or more codewords obtained from the protected data.

2. The data accessing method of claim 1, wherein one of the multiple sub-matrices of the part-one matrix comprises a first set of sequential columns next to the first portion of matrix elements in the first special column, and another of the multiple sub-matrices of the part-one matrix comprises a second set of sequential columns next to the second portion of matrix elements in the first special column.

3. The data accessing method of claim 2, wherein yet another of the multiple sub-matrices of the part-one matrix comprises a third set of sequential columns.

4. The data accessing method of claim 1, wherein each matrix element of the parity check matrix indicates a bit of information; and for a positive integer p, one of the multiple sub-matrices of the part-one matrix comprises a first set of sequential columns next to upper p bits in (p+2) bits of the first special column, and another of the multiple sub-matrices of the part-one matrix comprises a second set of sequential columns next to upper p bits in (p+2) bits of the second special column.

5. The data accessing method of claim 4, wherein said one of the multiple sub-matrices of the part-one matrix is a first $p \times (2^p - 1)$ matrix, and the first set of sequential columns carry sequential values of $\{1, 2, 3, \ldots, (2^p - 1)\}$, respectively; and said another of the multiple sub-matrices of the part-one matrix is a second $p \times (2^p - 1)$ matrix, and the second set of sequential columns carry sequential values of $\{1, 2, 3, \ldots, (2^p - 1)\}$, respectively.

6. The data accessing method of claim 1, wherein each of the multiple sub-matrices of the part-one matrix comprises a set of sequential columns carry sequential values, respectively; and in each column within the set of sequential columns, an uppermost matrix element and a bottommost matrix element represent a least significant bit (LSB) and a most significant bit (MSB) of a binary form of one of the sequential values carried by the set of sequential columns, respectively.

7. The data accessing method of claim 1, wherein each matrix element of the parity check matrix indicates a bit of information; for positive integers p and q, upper p bits in (p+2) bits of the first special column represent a binary form of q, and upper p bits in (p+2) bits of the second special column represent a binary form of (q+1), wherein $q \le 2^p - 2$; and the first special column is a beginning column of first $2^p$ columns of the part-one matrix, the second special column is a beginning column of subsequent $2^p$ columns of the part-one matrix, and remaining columns of the part-one matrix are subsequent q columns next to said subsequent $2^p$ columns of the part-one matrix.

8. The data accessing method of claim 7, wherein a part-two matrix of the parity check matrix comprises (p+2) columns next to said subsequent q columns.

9. The data accessing method of claim 8, wherein the part-two matrix is an identity matrix.

10. The data accessing method of claim 1, wherein a part-two matrix of the parity check matrix is an identity matrix.

11. The data accessing method of claim 1, wherein in any of the multiple sub-matrices of the part-one matrix, a set of sequential columns carrying sequential values are sequentially generated during error correction code (ECC) processing, rather than being stored in the decoding circuit in advance before the ECC processing, whereby internal storage space for storing pre-calculated information regarding the ECC processing within the memory controller is saved.

12. The data accessing method of claim 1, wherein the first special column, the second special column, and the fixed rows are arranged to make any two columns of the parity check matrix be different from each other and make each column of the parity check matrix be non-zero, whereby malfunction of the memory controller is prevented.

13. The data accessing method of claim 1, further comprising:
in response to a write request, utilizing an encoding circuit within the memory controller to generate the protected data according to the parity check matrix and to write the protected data into the predetermined storage space, wherein the write request is a request before the read request.

14. A memory device, comprising:
a non-volatile (NV) memory, arranged to store information, wherein the NV memory comprises at least one NV memory element; and
a memory controller, coupled to the NV memory, arranged to control operations of the memory device, wherein the memory controller comprises:
a processing circuit, arranged to control the memory controller according to a plurality of host commands from a host device, to allow the host device to access the NV memory through the memory controller; and
an error correction code (ECC) circuit, coupled to the processing circuit, arranged to perform ECC processing, wherein the ECC circuit comprises:
a decoding circuit, arranged to perform decoding with aid of a parity check matrix having partial sequential information, for data protection during data accessing;
wherein:
in response to a read request, the memory controller starts receiving protected data corresponding to the read request from predetermined storage space;
the memory controller utilizes the decoding circuit to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix;
the memory controller utilizes the decoding circuit to perform syndrome calculation based on the parity check matrix according to a codeword to generate and output a syndrome for the codeword, wherein the protected data comprises a read out version of one or more codewords comprising the codeword;
the memory controller utilizes the decoding circuit to perform error detection according to the syndrome to generate and output a decoding result signal, and perform error location decoding according to the syndrome to generate and output an error location; and
the memory controller utilizes the decoding circuit to perform error correction of the codeword, to correct an error at the error location of the codeword, in order to recover the codeword, for performing further processing according to the one or more codewords obtained from the protected data.

15. The memory device of claim 14, wherein one of the multiple sub-matrices of the part-one matrix comprises a first set of sequential columns next to the first portion of matrix elements in the first special column, and another of the multiple sub-matrices of the part-one matrix comprises a second set of sequential columns next to the second portion of matrix elements in the first special column.

16. The memory device of claim 15, wherein yet another of the multiple sub-matrices of the part-one matrix comprises a third set of sequential columns.

17. A memory controller of a memory device, the memory device comprising the memory controller and a non-volatile (NV) memory, the NV memory comprising at least one NV memory element, the memory controller comprising:
a processing circuit, arranged to control the memory controller according to a plurality of host commands from a host device, to allow the host device to access the NV memory through the memory controller; and
an error correction code (ECC) circuit, coupled to the processing circuit, arranged to perform ECC processing, wherein the ECC circuit comprises:
a decoding circuit, arranged to perform decoding with aid of a parity check matrix having partial sequential information, for data protection during data accessing;
wherein:
in response to a read request, the memory controller starts receiving protected data corresponding to the read request from predetermined storage space;
the memory controller utilizes the decoding circuit to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix;

the memory controller utilizes the decoding circuit to perform syndrome calculation based on the parity check matrix according to a codeword to generate and output a syndrome for the codeword, wherein the protected data comprises a read out version of one or more codewords comprising the codeword;

the memory controller utilizes the decoding circuit to perform error detection according to the syndrome to generate and output a decoding result signal, and perform error location decoding according to the syndrome to generate and output an error location; and the memory controller utilizes the decoding circuit to perform error correction of the codeword, to correct an error at the error location of the codeword, in order to recover the codeword, for performing further processing according to the one or more codewords obtained from the protected data.

18. The memory controller of claim 17, wherein one of the multiple sub-matrices of the part-one matrix comprises a first set of sequential columns next to the first portion of matrix elements in the first special column, and another of the multiple sub-matrices of the part-one matrix comprises a second set of sequential columns next to the second portion of matrix elements in the first special column.

19. The memory controller of claim 18, wherein yet another of the multiple sub-matrices of the part-one matrix comprises a third set of sequential columns.

20. A decoding circuit of a memory controller of a memory device, the memory device comprising the memory controller and a non-volatile (NV) memory, the memory controller comprising the decoding circuit, the NV memory comprising at least one NV memory element, the decoding circuit comprising:

a syndrome calculator, arranged to perform syndrome calculation based on a parity check matrix according to a codeword to generate and output a syndrome for the codeword, wherein in response to a read request, the memory controller starts receiving protected data corresponding to the read request from predetermined storage space, wherein the protected data comprises a read out version of one or more codewords comprising the codeword;

a parity check matrix generator, coupled to the syndrome calculator, arranged to generate the parity check matrix, wherein a part-one matrix of the parity check matrix comprises a first special column, a second special column, and multiple sub-matrices having sequential columns of matrix elements respectively corresponding to sequential numbers, the first special column carries a first predetermined value with a first portion of matrix elements in the first special column, and the second special column carries a second predetermined value with a second portion of matrix elements in the second special column, wherein last two rows of the part-one matrix are fixed rows respectively carrying two sets of predetermined bits, and the first portion of matrix elements and the second portion of matrix elements are in remaining rows of the part-one matrix of the parity check matrix; and an error location decoder, coupled to the syndrome calculator, arranged to perform error detection according to the syndrome to generate and output a decoding result signal, and perform error location decoding according to the syndrome to generate and output an error location;

wherein the decoding circuit performs error correction of the codeword, to correct an error at the error location of the codeword, in order to recover the codeword, to allow the memory controller to perform further processing according to the one or more codewords obtained from the protected data.

* * * * *